United States Patent
Ikeda et al.

(10) Patent No.: US 12,300,686 B2
(45) Date of Patent: *May 13, 2025

(54) DISPLAY APPARATUS

(71) Applicant: Japan Display Inc., Tokyo (JP)

(72) Inventors: Masanobu Ikeda, Tokyo (JP); Yasuhiro Kanaya, Tokyo (JP); Tadafumi Ozaki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/583,418

(22) Filed: Feb. 21, 2024

(65) Prior Publication Data

US 2024/0243116 A1 Jul. 18, 2024

Related U.S. Application Data

(63) Continuation of application No. 17/103,341, filed on Nov. 24, 2020, now Pat. No. 11,935,881, which is a continuation of application No. PCT/JP2019/016901, filed on Apr. 19, 2019.

(30) Foreign Application Priority Data

May 31, 2018 (JP) .................. 2018-105502

(51) Int. Cl.
| | |
|---|---|
| *H01L 25/16* | (2023.01) |
| *H01L 33/60* | (2010.01) |
| *G06F 3/041* | (2006.01) |
| *G06F 3/044* | (2006.01) |

(Continued)

(52) U.S. Cl.
CPC ........ *H01L 25/167* (2013.01); *G06F 3/04166* (2019.05); *G06F 3/044* (2013.01); *G09G 3/32* (2013.01); *G09G 2300/0809* (2013.01); *H01L 33/60* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 9,960,137 B1 * | 5/2018 | Huang | .................. H01L 24/05 |
| 2009/0206749 A1 | 8/2009 | Matsudate et al. | |

(Continued)

FOREIGN PATENT DOCUMENTS

| | | |
|---|---|---|
| CN | 107331680 A | 11/2017 |
| JP | 2003218392 A | 7/2003 |

(Continued)

OTHER PUBLICATIONS

International Search Report issued in Application No. PCT/JP2019/016901, dated Jul. 9, 2019.

*Primary Examiner* — Michelle Mandala
(74) *Attorney, Agent, or Firm* — K&L Gates LLP

(57) ABSTRACT

According to an aspect, a display apparatus includes: a substrate; a plurality of pixels arrayed on the substrate; a plurality of inorganic light-emitting elements that are provided in the pixels, respectively; a transistor provided to a first surface of the substrate and coupled to one of the inorganic light-emitting elements; wiring provided to the first surface of the substrate and coupled to the transistor; and a circular polarization plate provided on a first side of the substrate.

17 Claims, 16 Drawing Sheets

(51) Int. Cl.
　　　*G09G 3/32*　　　(2016.01)
　　　*H01L 33/62*　　　(2010.01)

(56) References Cited

U.S. PATENT DOCUMENTS

| | | | |
|---|---|---|---|
| 2014/0145324 A1* | 5/2014 | Uchibori | H01L 23/48 |
| | | | 257/737 |
| 2015/0043071 A1 | 2/2015 | Hatanaka et al. | |
| 2016/0195965 A1 | 7/2016 | Kim et al. | |
| 2017/0213502 A1 | 7/2017 | Henry et al. | |
| 2017/0294565 A1 | 10/2017 | Kim | |
| 2018/0095559 A1 | 4/2018 | Yamazaki et al. | |
| 2018/0304590 A1 | 10/2018 | Fukatani et al. | |
| 2019/0302936 A1 | 10/2019 | Clark et al. | |
| 2019/0361551 A1 | 11/2019 | Lius et al. | |
| 2021/0151524 A1 | 5/2021 | Tang et al. | |

FOREIGN PATENT DOCUMENTS

| | | | |
|---|---|---|---|
| JP | 2009193797 A | 8/2009 |
| JP | 2015163936 A | 9/2015 |
| JP | 2017054926 A | 3/2017 |
| JP | 2017529557 A | 10/2017 |
| JP | 2018060184 A | 4/2018 |
| WO | 2017061551 A1 | 4/2017 |

* cited by examiner

DISPLAY APPARATUS

CROSS-REFERENCE TO RELATED APPLICATION

This application is a continuation of U.S. patent application Ser. No. 17/103,341 filed on Nov. 24, 2020, which application is a continuation of International Patent Application No. PCT/2019/016901 filed on Apr. 19, 2019, which application claims the benefit of priority from Japanese Patent Application No. 2018-105502 filed on May 31, 2018, the entire contents of which are incorporated herein by reference.

BACKGROUND

1. Technical Field

The present disclosure relates to a display apparatus.

2. Description of the Related Art

Inorganic electroluminescent (EL) displays provided with inorganic light-emitting diodes (micro LEDs) serving as display elements have recently been attracting attention (refer to Japanese Translation of PCT International Application Publication No. 2017-529557, for example). In inorganic EL displays, a plurality of light-emitting elements that emit light in different colors are arrayed on an array substrate. Inorganic EL displays do not require any light source because they are provided with self-emitting elements, and have higher light use efficiency because light is emitted without passing through a color filter. Inorganic EL displays have higher environmental resistance than organic EL displays provided with organic light-emitting diodes (OLEDs) serving as display elements.

A plurality of pixels included in an inorganic EL display are provided with a plurality of transistors. The transistors are coupled to a power-supply line, gate lines, or signal lines via low-resistance wiring. The low-resistance wiring has high reflectance of visible light. When the inorganic EL display is used outdoors, for example, the low-resistance wiring may possibly reflect external light and reduce the luminance of an image, thereby deteriorating display quality.

SUMMARY

According to an aspect, a display apparatus includes: a substrate; a plurality of pixels arrayed on the substrate; a plurality of inorganic light-emitting elements that are provided in the pixels, respectively; a transistor provided to a first surface of the substrate and coupled to one of the inorganic light-emitting elements; wiring provided to the first surface of the substrate and coupled to the transistor; and a circular polarization plate provided on a first side of the substrate.

According to another aspect, a display apparatus includes: a substrate; a plurality of pixels arrayed on the substrate; a plurality of inorganic light-emitting elements that are provided in the pixels, respectively; a transistor provided to a first surface of the substrate and coupled to one of the inorganic light-emitting elements; wiring provided to the first surface of the substrate and coupled to the transistor; a circular polarization plate provided on a first side of the substrate; a first adhesive layer that is translucent and provided between the substrate and the circular polarization plate and that is in contact with the circular polarization plate; and a translucent flattening layer provided between the first adhesive layer and the substrate. A thickness of the flattening layer is greater than a thickness of the one of the inorganic light-emitting elements. A thickness of the first adhesive layer is greater than the thickness of the one of the inorganic light-emitting elements.

DETAILED DESCRIPTION

Figure 1:
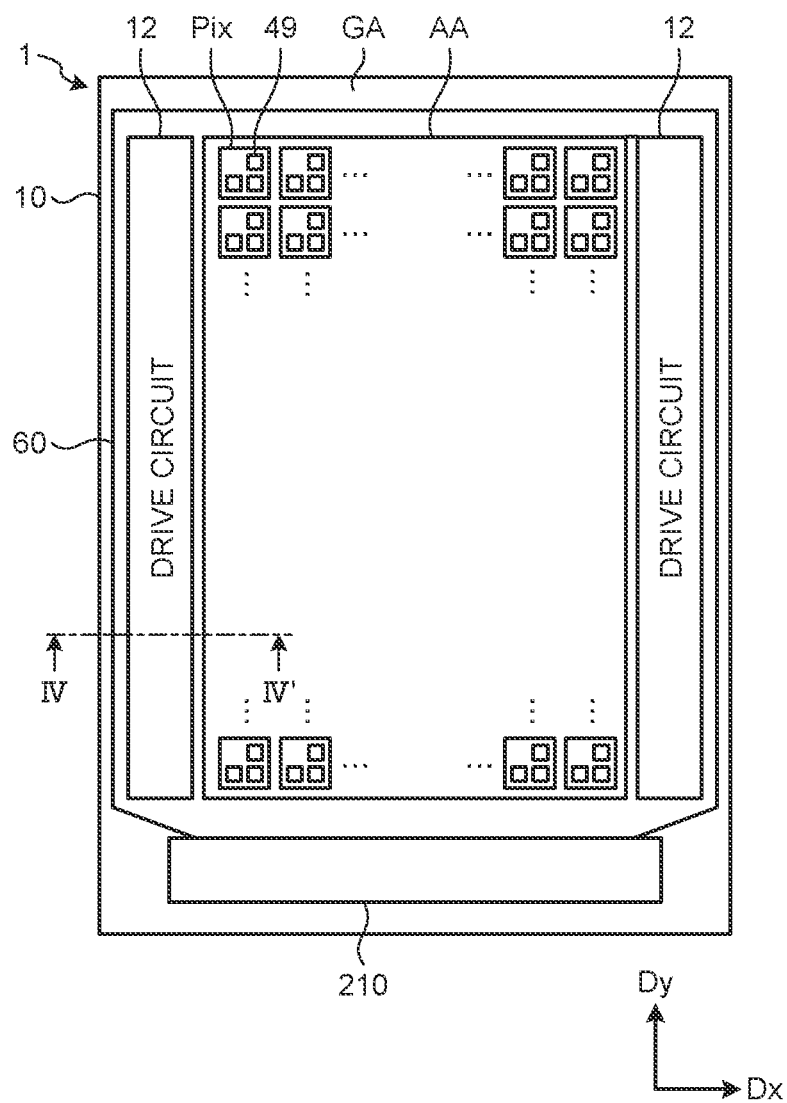
FIG. 1 is a plan view of an exemplary configuration of a display apparatus according to an embodiment.

Exemplary embodiments according to the present disclosure are described below with reference to the accompanying drawings. What is disclosed herein is given by way of example only, and appropriate changes made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the figures, components similar to those previously described with reference to previous figures are denoted by the same reference numerals, and detailed explanation thereof may be appropriately omitted.

FIG. 1 is a plan view of an exemplary configuration of a display apparatus according to an embodiment. As illustrated in FIG. 1, a display apparatus 1 includes an array substrate 2, a plurality of pixels Pix, drive circuits 12, a drive integrated circuit (IC) 210, and cathode wiring 60. The array substrate 2 is a drive circuit board for driving the pixels Pix and is also called a backplane or an active matrix substrate.

As illustrated in FIG. 1, the display apparatus 1 has a display region AA and a peripheral region GA. The display region AA is provided with the pixels Pix and displays an image. The peripheral region GA does not overlap the pixels Pix and is disposed outside the display region AA.

The pixels Pix are arrayed in a first direction Dx and a second direction Dy in the display region AA. The first direction Dx and the second direction Dy are parallel to a first surface 10a (refer to FIG. 4) of a substrate 10 of the array substrate 2. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the substrate 10, for example. In the following description, planar view indicates the positional relation when viewed from the third direction Dz.

The drive circuits 12 drive a plurality of gate lines (first gate lines GCL1 and second gate lines GCL2 (refer to FIG. 3)) based on various control signals received from the drive IC 210. The drive circuits 12 sequentially or simultaneously select a plurality of gate lines and supply gate drive signals to the selected gate lines. As a result, the drive circuits 12 select a plurality of pixels Pix coupled to the gate lines.

The drive IC 210 is a circuit that controls display on the display apparatus 1. The drive IC 210 may be mounted on the peripheral region GA of the substrate 10 by chip-on-glass (COG) bonding. The mounting form of the drive IC 210 is not limited thereto, and the drive IC 210 may be mounted on FPCs or a rigid substrate coupled to the peripheral region GA of the substrate 10 by chip-on-film (COF) bonding.

The cathode wiring 60 is provided in the peripheral region GA of the substrate 10. The cathode wiring 60 is provided surrounding the pixels Pix in the display region AA and the drive circuits 12 in the peripheral region GA. Cathodes (refer to FIG. 4) of a plurality of inorganic light-emitting elements 100 (refer to FIG. 4) are coupled to the common cathode wiring 60 and supplied with a fixed potential (e.g., a ground potential). More specifically, a cathode terminal 55p (second terminal) of the inorganic light-emitting element 100 is coupled to the cathode wiring 60 via a cathode electrode 55e (second electrode) provided to a TFT substrate.

Figure 2:
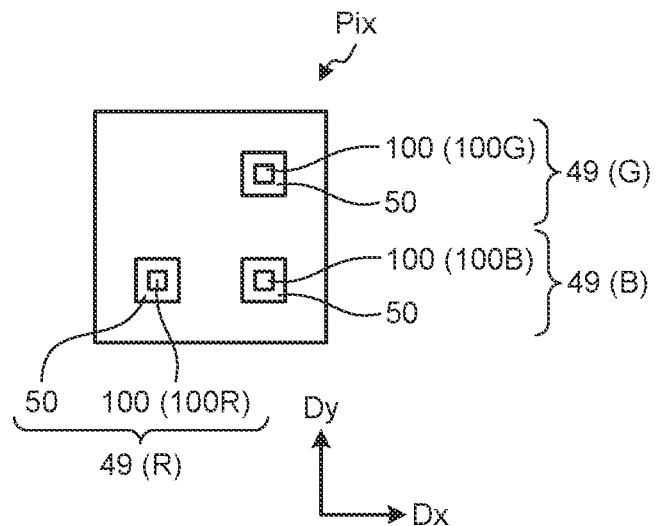
FIG. 2 is a plan view of an exemplary configuration of a pixel.

FIG. 2 is a plan view of an exemplary configuration of the pixel. As illustrated in FIG. 2, one pixel Pix includes a plurality of pixels 49. The pixel Pix includes a first pixel 49R, a second pixel 49G, and a third pixel 49B, for example. The first pixel 49R displays a primary color of red as the first color. The second pixel 49G displays a primary color of green as the second color. The third pixel 49B displays a primary color of blue as the third color. As illustrated in FIG. 2, the first pixel 49R and the third pixel 49B are disposed in the first direction Dx in one pixel Pix. The second pixel 49G and the third pixel 49B are disposed in the second direction Dy. The first color, the second color, and the third color are not limited to red, green, and blue, respectively, and may be any desired colors, such as complementary colors. In the following description, the first pixel 49R, the second pixel 49G, and the third pixel 49B are referred to as pixels 49 when they need not be distinguished from one another.

The pixels 49 each include the inorganic light-emitting element 100. The display apparatus 1 displays an image by emitting different light from the respective inorganic light-emitting elements 100 in the first pixel 49R, the second pixel 49G, and the third pixel 49B. The inorganic light-emitting element 100 is an inorganic light-emitting diode (LED) chip having a size of approximately 3 μm to 300 μm in planar view and is called a micro LED. A display apparatus including the micro LEDs in the respective pixels is also called a micro LED display apparatus. The term "micro" of the micro LED is not intended to limit the size of the inorganic light-emitting element 100.

Figure 3:
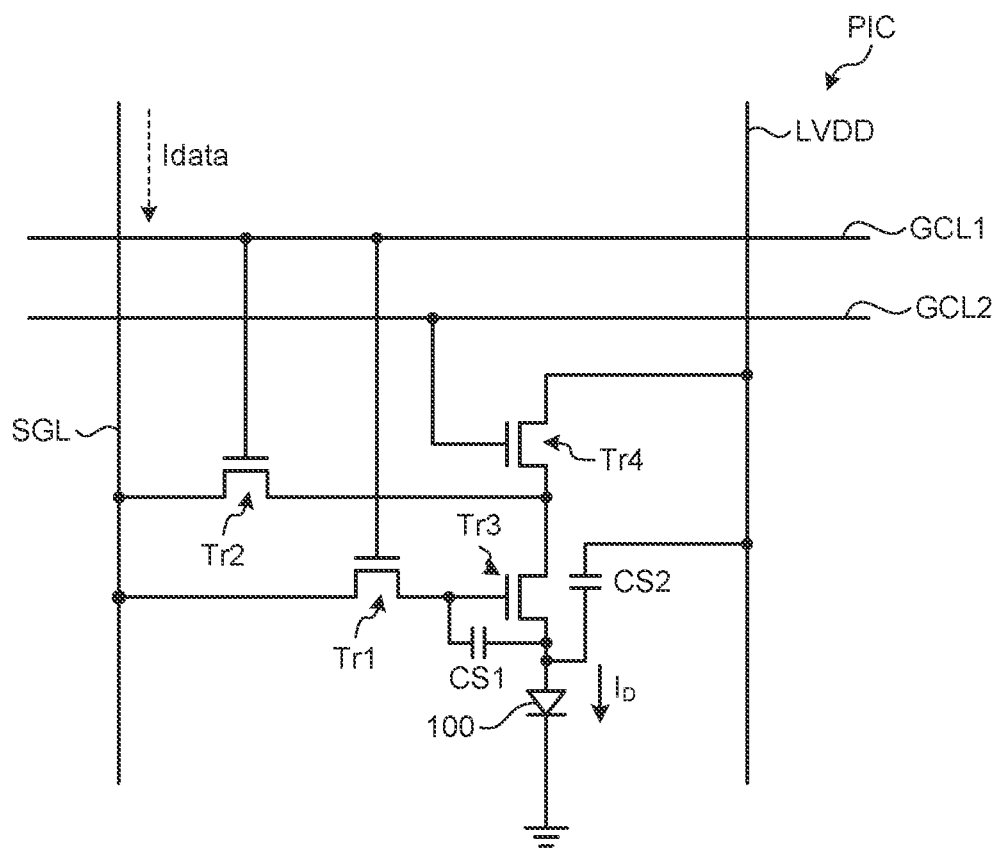
FIG. 3 is a circuit diagram of an exemplary configuration of a pixel of the display apparatus according to the embodiment.

FIG. 3 is a circuit diagram of an exemplary configuration of a pixel circuit of the display apparatus according to the embodiment. A pixel circuit PIC is a drive circuit that drives the inorganic light-emitting element 100. As illustrated in FIG. 3, the pixel circuit PIC includes a switching transistor Tr1, current switching transistors Tr2 and Tr4, a drive transistor Tr3, and the inorganic light-emitting element 100. The transistors Tr1 to Tr4 and a transistor Tr5 (refer to FIG. 4), which will be described later, are thin-film transistors (TFTs).

The gate of the transistor Tr1 is coupled to the first gate line GCL1, the source thereof is coupled to a signal line SGL, and the drain thereof is coupled to the gate of the transistor Tr3. The gate of the transistor Tr2 is coupled to the first gate line GCL1, the source thereof is coupled to the signal line SGL, and the drain thereof is coupled to the source of the transistor Tr3 and the drain of the transistor Tr4. The gate of the transistor Tr3 is coupled to the drain of the transistor Tr1, the source thereof is coupled to the drains of the respective transistors Tr2 and Tr4, and the drain thereof is coupled to the anode of the inorganic light-emitting element 100. The gate of the transistor Tr4 is coupled to the second gate line GCL2, the source thereof is coupled to a power-supply line LVDD, and the drain thereof is coupled to the drain of the transistor Tr2 and the source of the transistor Tr3.

A first end of first capacitance CS1 is coupled to the drain of the transistor Tr1 and the gate of the transistor Tr3, and a second end thereof is coupled to the drain of the transistor Tr3 and the anode of the inorganic light-emitting element 100. A first end of second capacitance CS2 is coupled to the power-supply line LVDD, and a second end thereof is coupled to the anode of the inorganic light-emitting element 100. The first capacitance CS1 and the second capacitance CS2 are added to the pixel circuit PIC to prevent fluctuations in a gate voltage due to parasitic capacitance and current leakage of the transistor Tr1. The cathode terminal 55p of the inorganic light-emitting element 100 is coupled to a ground potential. The reference potential is a ground potential, for example.

The power-supply line LVDD is coupled to a constant voltage source. The power-supply line LVDD supplies a DC constant voltage Vdd to the source of the transistor Tr4 and the first end of the second capacitance CS2. The signal line SGL is coupled to a constant current source. The signal line SGL supplies a DC constant current Idata to the sources of the respective transistors Tr1 and Tr2. The first gate line GCL1 and the second gate line GCL2 are coupled to the drive circuit 12 (refer to FIG. 1).

When the display apparatus 1 switches the electric potential of the first gate line GCL1 to High and switches the electric potential of the second gate line GCL2 to Low, the transistors Tr1 and Tr2 are turned ON, and the transistor Tr4 is turned OFF. As a result, the constant current Idata is supplied from the signal line SGL to the inorganic light-emitting element 100. When the display apparatus 1 switches the electric potential of the first gate line GCL1 to Low and switches the electric potential of the second gate line GCL2 to High, the transistors Tr1 and Tr2 are turned OFF, and the transistor Tr4 is turned ON. As a result, the constant voltage Vdd is supplied from the power-supply line LVDD to the inorganic light-emitting element 100.

Figure 4:
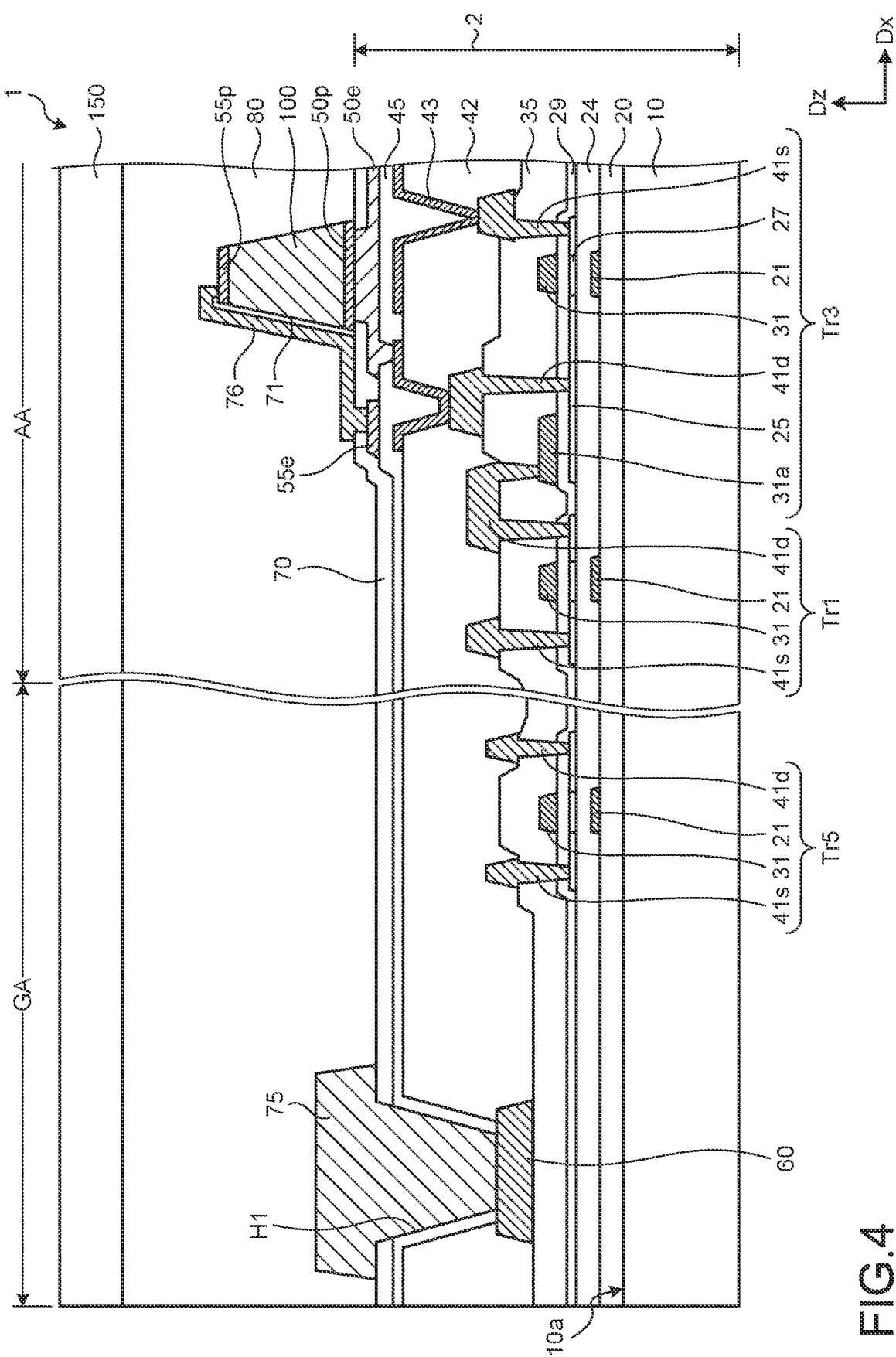
FIG. 4 is a sectional view of an exemplary configuration of the display apparatus.
Figure 5:
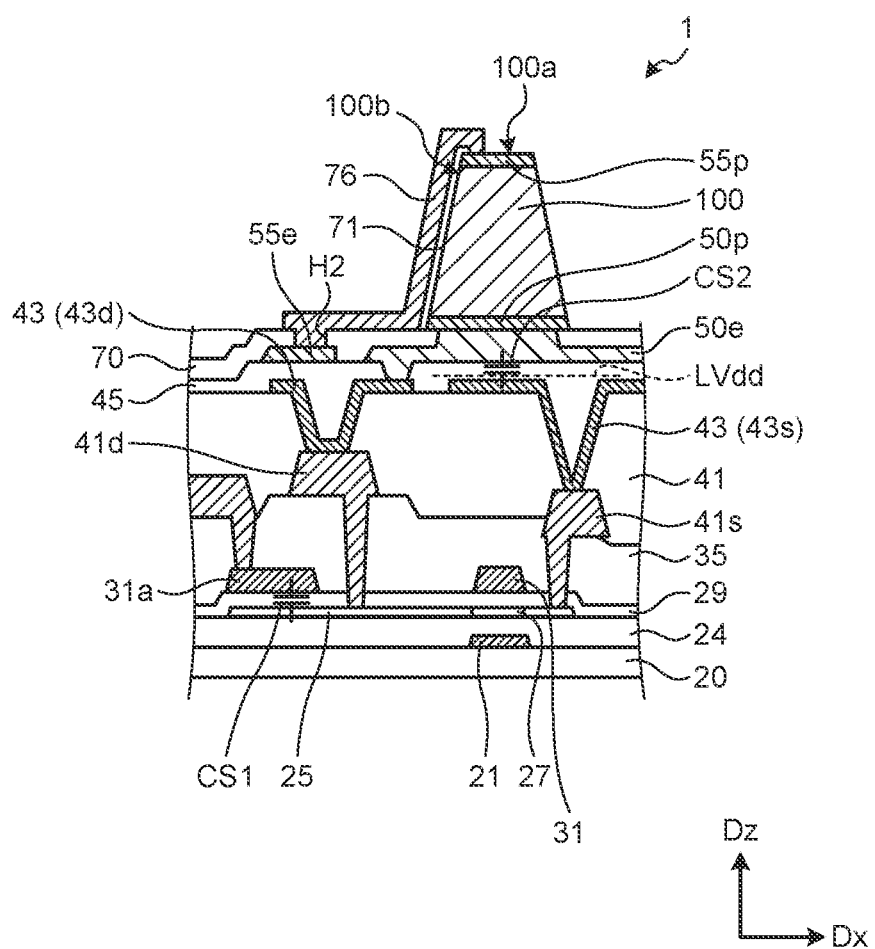
FIG. 5 is an enlarged sectional view of an inorganic light-emitting element and a transistor coupled to the inorganic light-emitting element in the display apparatus.

FIG. 4 is a sectional view of an exemplary configuration of the display apparatus. FIG. 4 illustrates a section of the plan view in FIG. 1 along line IV-IV'. FIG. 5 is an enlarged sectional view of the inorganic light-emitting element and the transistor coupled to the inorganic light-emitting element in the display apparatus. As illustrated in FIGS. 4 and 5, the display apparatus 1 includes the substrate 10, an undercoat layer 20, and a plurality of transistors. The undercoat layer 20 is provided on the first surface 10a of the substrate 10. The transistors are provided on the undercoat layer 20. In the display region AA of the substrate 10, for example, the transistors Tr1, Tr2, Tr3, and Tr4 included in the pixel 49 are provided as the transistors. In the peripheral region GA of the substrate 10, the transistors Tr5 included in the drive circuits 12 are provided as the transistors.

The substrate 10 is a glass substrate, a quartz substrate, or a flexible substrate made of acrylic resin, epoxy resin, polyimide resin, or polyethylene terephthalate (PET) resin, for example. The transistors Tr1 to Tr5 are TFTs having a double-sided gate structure, for example. The transistors Tr1 to Tr5 each include a first gate electrode 21, an insulating film 24, a semiconductor layer 25, an insulating film 29, and a second gate electrode 31. The first gate electrode 21 is provided on the undercoat layer 20. The insulating film 24 is provided on the undercoat layer 20 to cover the first gate electrode 21. The semiconductor layer 25 is provided on the insulating film 24. The insulating film 29 is provided on the semiconductor layer 25. The second gate electrode 31 is provided on the insulating film 29. The insulating films 24 and 29 are inorganic insulating films made of $SiO_2$ or SiN, for example. The first gate electrode 21 and the second gate electrode 31 face each other in the third direction Dz with the insulating film 24, the semiconductor layer 25, and the insulating film 29 interposed therebetween. The part of the insulating films 24 and 29 sandwiched between the first gate electrode 21 and the second gate electrode 31 functions as a gate insulating film. The part of the semiconductor layer 25 sandwiched between the first gate electrode 21 and the second gate electrode 31 functions as a channel 27 of the TFT. The part of the semiconductor layer 25 coupled to a source electrode 41s, which will be described later, corresponds to the source of the TFT, and the part coupled to a drain electrode 41d, which will be described later, corresponds to the drain of the TFT.

The structure of the transistors Tr1 to Tr5 according to the embodiment is not limited to the double-sided gate structure. The transistors Tr1 to Tr5 may have a bottom-gate structure in which the gate electrode is composed of only the first gate electrode 21. Alternatively, the transistors Tr1 to Tr5 may have a top-gate structure in which the gate electrode is composed of only the second gate electrode 31. The undercoat layer 20 is not necessarily provided.

The display apparatus 1 also includes an insulating film 35, the source electrode 41s, the drain electrode 41d, the cathode wiring 60, and an insulating film 42. The insulating film 35 is provided on the first surface of the substrate 10 to cover the transistors Tr1 to Tr5. The source electrode 41s passes through the insulating film 35 and is coupled to the sources of the respective transistors Tr1 to Tr5. The drain electrode 41d passes through the insulating film 35 and is coupled to the drains of the respective transistors Tr1 to Tr5. The cathode wiring 60 is provided on the insulating film 35. The insulating film 42 covers the source electrode 41s, the drain electrode 41d, and the cathode wiring 60. The insulating film 35 is an inorganic insulating film, and the insulating film 42 is an organic insulating film.

The display apparatus 1 also includes source coupling wiring 43s, drain coupling wiring 43d, and an insulating film 45. The source coupling wiring 43s passes through the insulating film 42 and is coupled to the source electrode 41s. The drain coupling wiring 43d passes through the insulating film 42 and is coupled to the drain electrode 41d. The insulating film 45 is provided on the insulating film 42 and covers the source coupling wiring 43s and the drain coupling wiring 43d. The display apparatus 1 also includes an anode electrode 50e (first electrode) and a cathode electrode 55e (second electrode) provided on the insulating film 45. The anode electrode 50e passes through the insulating film 45 and is coupled to the drain coupling wiring 43d of the transistor Tr3. The cathode electrode 55e is coupled to a coupler 75, which will be described later, provided in the peripheral region GA via partial cathode wiring. The coupler 75 is electrically coupled to the cathode wiring 60 at the bottom of a contact hole H1, which will be described later. With this configuration, the cathodes (cathode terminals 55p) of the respective inorganic light-emitting elements 100 are each electrically coupled to the cathode wiring 60 via a conductor 76, which will be described later, and the cathode electrode 55e.

The display apparatus 1 also includes an insulating film 70, the coupler 75, an insulating film 71, and the conductor 76. The insulating film 70 is provided on the insulating film 45 and covers the side surfaces of the anode electrode 50e and the cathode electrode 55e. The insulating film 71 covers a side surface 100b of the inorganic light-emitting element 100. The conductor 76 couples an upper surface 100a (cathode terminal 55p) of the inorganic light-emitting element 100 to the cathode electrode 55e. The insulating films 70 and 71 are inorganic insulating films.

In the peripheral region GA, the insulating films 70, 45, and 42 have the contact hole H1 the bottom surface of which corresponds to the cathode wiring 60. The coupler 75 is coupled to the cathode wiring 60 through the contact hole H1.

The conductor 76 is provided facing the side surface 100b of the inorganic light-emitting element 100 with the insulating film 71 interposed therebetween. The conductor 76 covers a region from the upper surface 100a through the side surface 100b of the inorganic light-emitting element 100 to the cathode electrode 55e. The upper end of the conductor 76 is coupled to the upper surface 100a (cathode terminal 55p) of the inorganic light-emitting element 100. The lower end of the conductor 76 is coupled to the cathode electrode 55e through a contact hole H2 formed in the insulating film 70.

The display apparatus 1 also includes a translucent adhesive layer 80 and a circular polarization plate 150. The adhesive layer 80 is provided on the insulating film 70 and covers the inorganic light-emitting element 100, the conductor 76, and the coupler 75. The circular polarization plate 150 is provided on the adhesive layer 80. The adhesive layer 80 is a polarization plate adhesive for bonding the circular polarization plate 150 to the first surface 10a of the substrate 10. The material of the adhesive layer 80 is acrylic polymer, for example. The adhesive layer 80 is not limited to a single-layered film and may be a multilayered film. The adhesive layer 80, for example, may be a multilayered film including a first layer with an antireflection function and a second layer with an adhesion function.

The circular polarization plate 150 includes a linear polarization plate and a quarter retardation plate (also called a quarter wave plate) provided on a first surface of the linear polarization plate, for example. The quarter retardation plate is positioned closer to the substrate 10 than the linear polarization plate is. Outside light (incident light), for example, passes through the linear polarization plate, thereby being converted into linearly polarized light. The linearly polarized light passes through the quarter retardation plate, thereby being converted into circularly polarized light. The circularly polarized light is reflected by the wiring, thereby being converting into circularly polarized light (reflected light) turning in a direction opposite to the direction of the incident light. The reflected light passes through the quarter retardation plate again, thereby being converted into linearly polarized light orthogonal to the incident light and absorbed by the linear polarization plate. As a result, the display apparatus 1 prevents reflection of external light.

In the display apparatus 1, the array substrate 2 includes the layers from the substrate 10 to the anode electrode 50e and the cathode electrode 55e. The array substrate 2 does not include the insulating films 70 and 71, the conductor 76, the inorganic light-emitting element 100, the adhesive layer 80, or the circular polarization plate 150.

The following describes the materials of the layers provided on the first surface 10a of the substrate 10. The first gate electrode 21, the second gate electrode 31, the source electrode 41s, the drain electrode 41d, the source coupling wiring 43s, the drain coupling wiring 43d, the anode electrode 50e, the cathode electrode 55e, the cathode wiring 60, the coupler 75, and the conductor 76 are made of titanium (Ti), molybdenum (Mo), tungsten (W), tantalum (Ta), niobium, indium tin oxide (ITO), aluminum (Al), Al alloy, silver (Ag), Ag alloy, copper (Cu), Cu alloy, carbon nanotube, graphite, graphene, or carbon nanobud, for example. The first gate electrode 21, the second gate electrode 31, the source electrode 41s, the drain electrode 41d, the source coupling wiring 43s, the drain coupling wiring 43d, the anode electrode 50e, the cathode electrode 55e, the cathode wiring 60, the coupler 75, and the conductor 76 may be single-layered or multilayered films.

The semiconductor layer 25 is made of amorphous silicon, microcrystalline oxide semiconductor, amorphous oxide semiconductor, polycrystalline silicon, low-temperature polycrystalline silicon (hereinafter, referred to as LTPS), or gallium nitride (GaN), for example. Examples of the oxide semiconductor include, but are not limited to, IGZO, zinc oxide (ZnO), ITZO, etc. IGZO is indium gallium zinc oxide, and ITZO is indium tin zinc oxide.

The insulating films 24, 29, 35, 45, 70, and 71 are made of inorganic insulating material, such as a silicon oxide film ($SiO_2$), a silicon nitride film (SiN), and a silicon oxynitride film (SiON), for example. The insulating films 24, 29, 35, 45, 70, and 71 are not limited to single layers and may be multilayered films. The insulating film 71 may be made of chemically stable aluminum oxide (e.g., $Al_2O_3$). The insulating film 42 is made of organic insulating material, such as acrylic resin and epoxy resin. The insulating film 42 is not limited to a single layer and may be a multilayered film.

Figure 6:
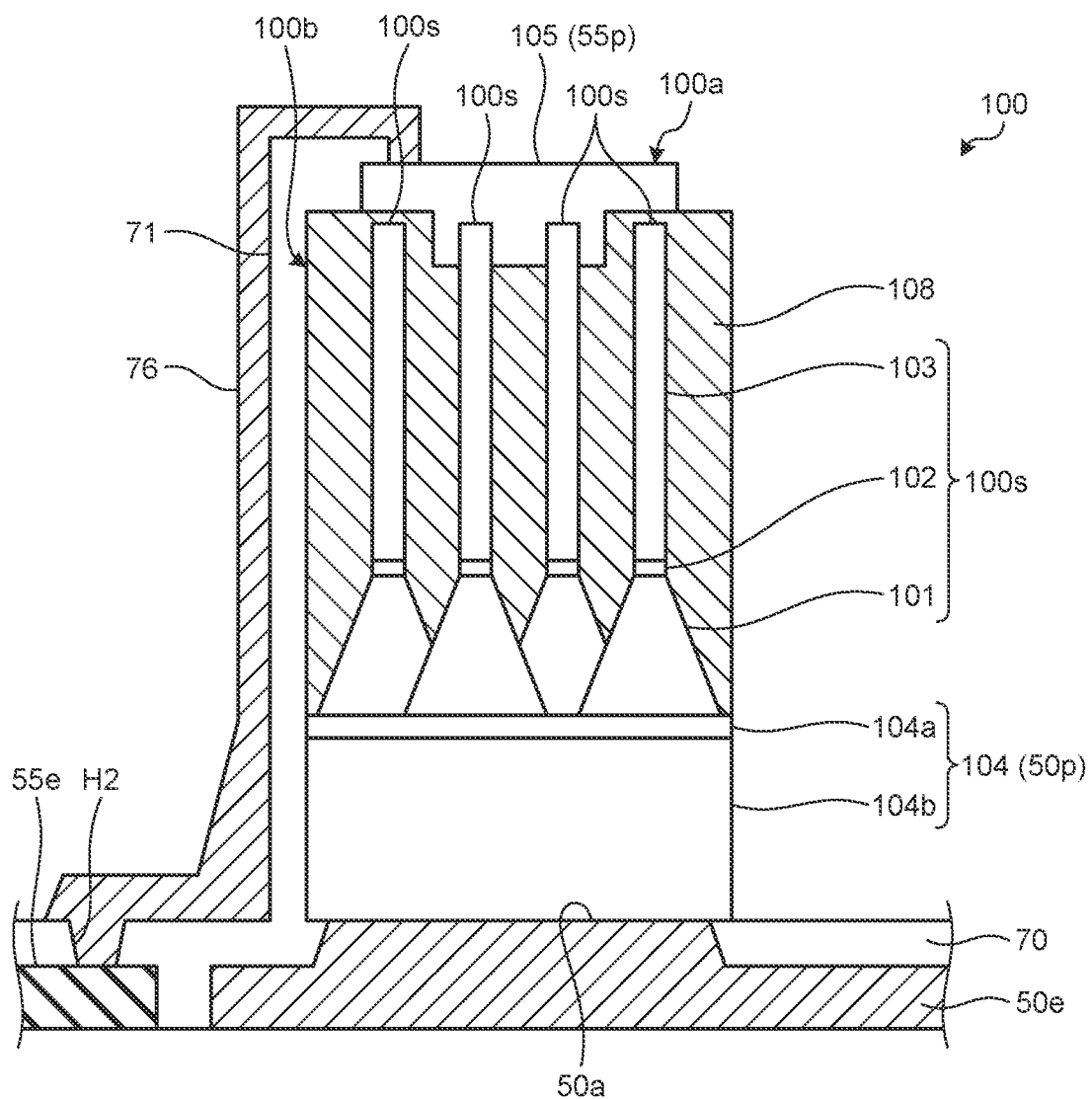
FIG. 6 is a sectional view of an exemplary configuration of the inorganic light-emitting element according to the embodiment.

FIG. 6 is a sectional view of an exemplary configuration of the inorganic light-emitting element according to the embodiment. As illustrated in FIG. 6, the inorganic light-emitting element 100 includes a plurality of partial light-emitting elements 100s, a protective layer 108, a p-type electrode 104 (including an anode terminal 50p), and an n-type electrode 105 (including the cathode terminal 55p). The protective layer 108 covers the partial light-emitting elements 100s. The partial light-emitting elements 100s have a columnar shape and are provided between the p-type electrode 104 and the n-type electrode 105. The partial light-emitting elements 100s each include an n-type cladding layer 103, an active layer 102, and a p-type cladding layer 101. The n-type electrode 105 is electrically coupled to the n-type cladding layer 103. The p-type electrode 104 is electrically coupled to the p-type cladding layer 101. The p-type cladding layer 101, the active layer 102, and the n-type cladding layer 103 are layered on the p-type electrode 104 in the order as listed.

The n-type cladding layer 103, the active layer 102, and the p-type cladding layer 101 are light-emitting layers and are made of a compound semiconductor, such as gallium nitride (GaN) and aluminum indium phosphorus (AlInP).

The n-type electrode 105 is made of translucent conductive material, such as ITO. The n-type electrode 105 serves as the cathode terminal 55p of the inorganic light-emitting element 100 and is coupled to the cathode electrode 55e via the conductor 76. The p-type electrode 104 serves as the anode terminal 50p of the inorganic light-emitting element 100 and includes a Pt layer 104a and a thick Au layer 104b produced by plating. The thick Au layer 104b is coupled to a placement surface 50a of the anode electrode 50e. The protective layer 108 is a spin on glass (SOG), for example. A side surface of the protective layer 108 corresponds to the side surface 100b of the inorganic light-emitting element 100.

Figure 7:
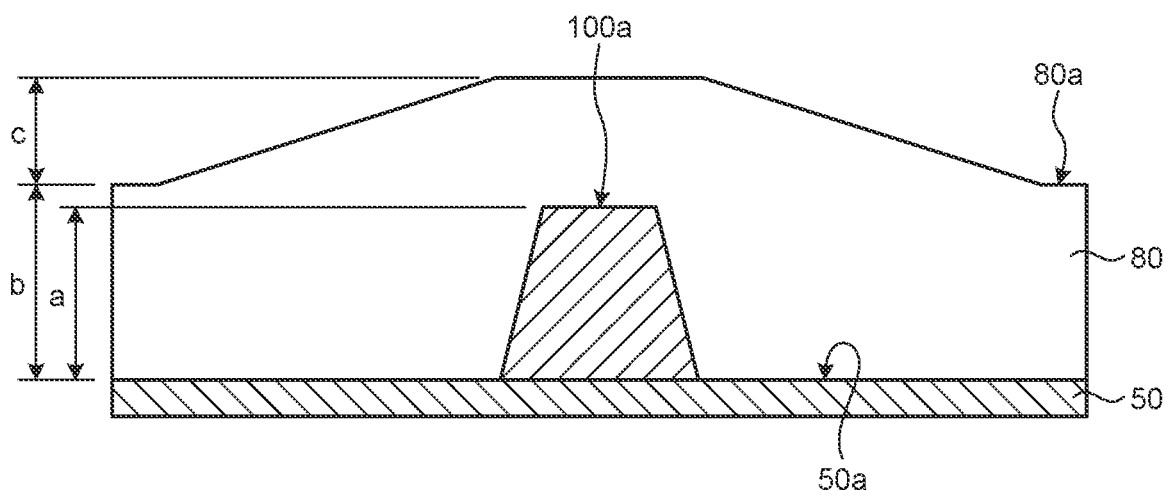
FIG. 7 is a sectional view illustrating a relation between the height of the inorganic light-emitting element and the thickness of an adhesive layer.

FIG. 7 is a sectional view illustrating a relation between the height of the inorganic light-emitting element and the thickness of the adhesive layer. As illustrated in FIG. 7, the a represents the height of the inorganic light-emitting element 100, and the b represents the thickness of the adhesive layer 80, with respect to the placement surface 50a of the anode electrode 50e serving as a reference plane. The height a is the distance from the placement surface 50a of the anode electrode 50e to the upper surface 100a of the inorganic light-emitting element 100. The thickness b is the distance from the placement surface 50a of the anode electrode 50e to an upper surface 80a of the adhesive layer 80 in a region that is away from the inorganic light-emitting element 100 and where the adhesive layer 80 is flatly formed. The region that is away from the inorganic light-emitting element 100 and where the adhesive layer 80 is flatly formed is the peripheral region GA (refer to FIG. 4), for example.

The thickness b of the adhesive layer 80 according to the present embodiment is preferably equal to or greater than 1.5 times the height a of the inorganic light-emitting element 100 ($b \div a \geq 1.5$). This structure can decrease a level difference on the upper surface 80a of the adhesive layer 80, thereby increasing the flatness of the adhesive layer 80. For example, the c represents the largest level difference on the upper surface 80a of the adhesive layer 80 in the display region AA. When $b \div a \geq 1.5$ is satisfied, the flatness of the adhesive layer 80 can be 30 or greater. The flatness is expressed by $100 \times (b-c) \div b$. If the flatness of the adhesive layer 80 is 30 or greater, the circular polarization plate 150 (refer to FIG. 4) can be easily bonded in parallel to the first surface 10a (refer to FIG. 4) of the substrate 10.

As described above, the display apparatus 1 according to the embodiment includes the substrate 10, the pixels 49, the inorganic light-emitting elements 100, the transistors Tr1 to Tr5, the wiring, and the circular polarization plate 150. The pixels 49 are arrayed on the substrate 10 and display different colors. The inorganic light-emitting elements 100 are provided to the respective pixels 49. The transistors Tr1 to Tr5 are provided to the first surface 10a of the substrate 10 and are each coupled to the inorganic light-emitting element 100. The wiring (e.g., the first gate line GCL1, the second gate line GCL2, the signal line SGL, the power-supply line LVDD, the source electrode 41s, the drain electrode 41d, the coupler 75, and the conductor 76) is provided to the first surface 10a of the substrate 10 and coupled to the transistors Tr1 to Tr5. The circular polarization plate 150 is provided on a first side of the substrate 10. With this configuration, the circular polarization plate 150 absorbs reflected light that passes through the circular polarization plate 150 and is reflected by the surface of the wiring. If external light (e.g., intense visible light) is incident on the screen of the display apparatus 1 outdoors, for example, the display apparatus 1 can prevent reflection of the external light and reduction in luminance. Consequently, the display apparatus 1 can prevent deterioration of display quality.

The display apparatus 1 also includes a first adhesive layer (e.g., the adhesive layer 80) that is translucent and provided between the substrate 10 and the circular polarization plate 150 and that is in contact with the circular polarization plate 150. With the adhesive layer 80, the circular polarization plate 150 is bonded to the first surface 10a of the substrate 10.

First Modification

In the embodiment described above, the first surface 10a of the substrate 10 is flattened by the adhesive layer 80. The insulating material for flattening according to the embodiment is not limited to the adhesive layer 80. The first surface 10a of the substrate 10 may be flattened by insulating material provided separately from the adhesive layer 80.

Figure 8:
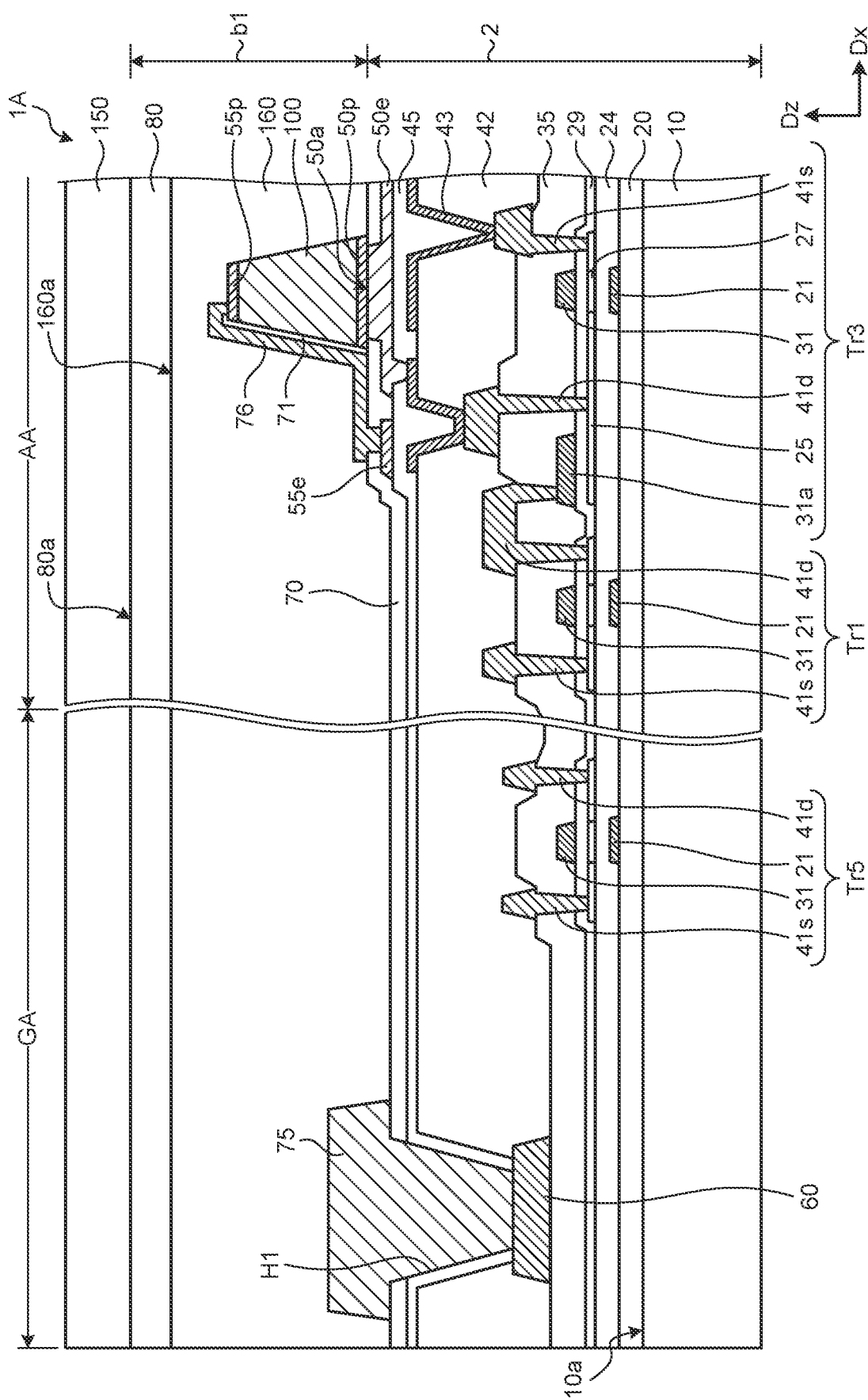
FIG. 8 is a sectional view of the display apparatus according to a first modification of the embodiment.

FIG. 8 is a sectional view of the display apparatus according to a first modification of the embodiment. As illustrated in FIG. 8, a display apparatus 1A according to the first modification includes a translucent flattening layer 160 provided between the substrate 10 and the adhesive layer 80. The flattening layer 160 is made of insulating material, such as epoxy resin and silicone resin. The thickness of the flattening layer 160 is greater than that of the adhesive layer 80. The flattening layer 160 covers the inorganic light-emitting element 100 and the coupler 75 and flattens the first surface 10a of the substrate 10.

In the first modification, the b1 represents the sum of the thickness of the flattening layer 160 and the thickness of the adhesive layer 80. The thickness of the flattening layer 160 is the distance from the placement surface 50a (refer to FIG. 7) of the anode electrode 50e to an upper surface 160a of the flattening layer 160 in a region (e.g., the peripheral region GA) that is away from the inorganic light-emitting element 100 and where the adhesive layer 80 is flatly formed. In the first modification, the thickness b1 is preferably equal to or greater than 1.5 times the height a (refer to FIG. 7) of the inorganic light-emitting element 100 (b1÷a≥1.5). In a manner similar to the embodiment above, this structure can decrease a level difference on the upper surface 80a of the adhesive layer 80, thereby increasing the flatness of the adhesive layer 80. As a result, the circular polarization plate 150 can be easily bonded in parallel to the first surface 10a of the substrate 10.

Second Modification

Figure 9:
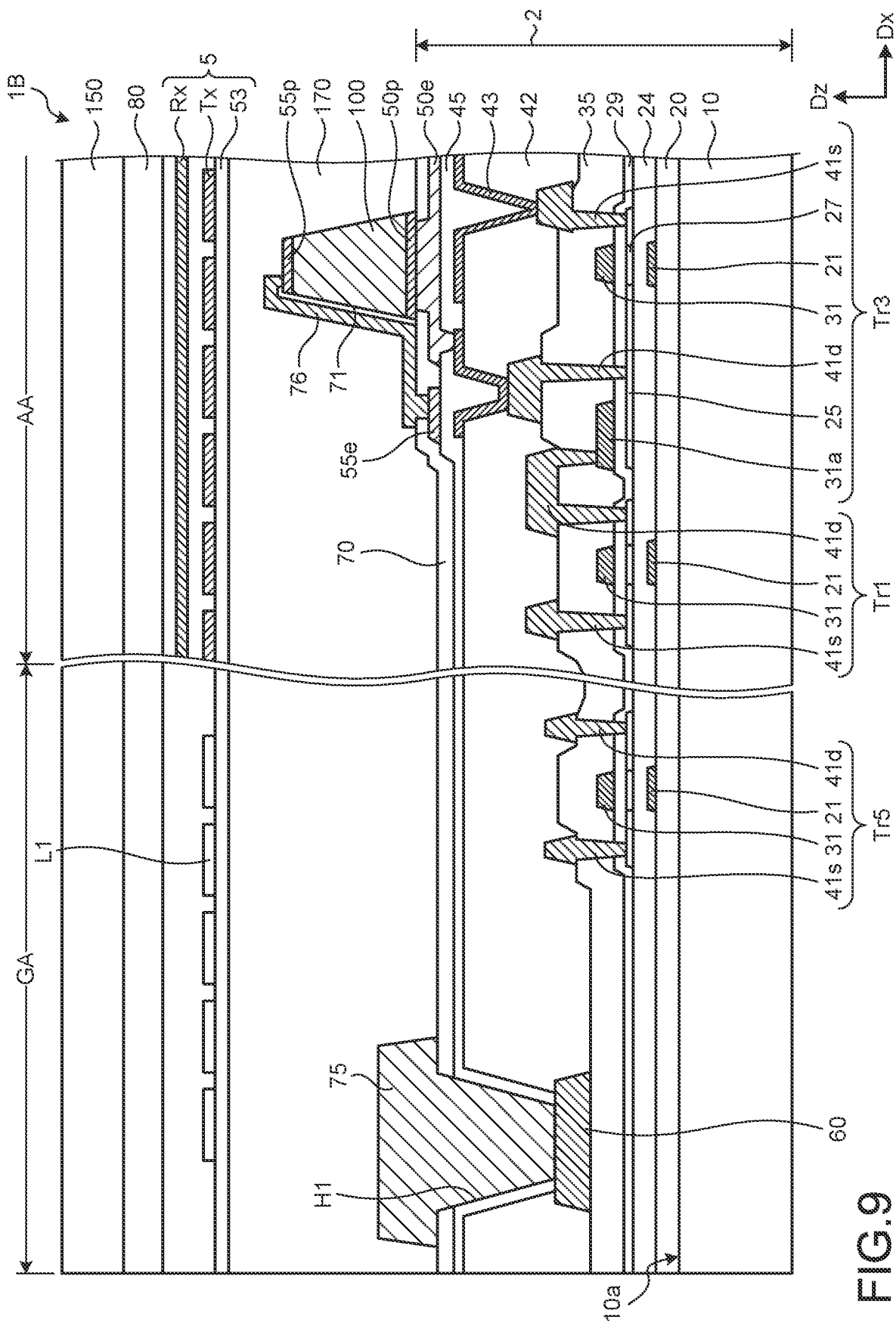
FIG. 9 is a sectional view of the display apparatus according to a second modification of the embodiment.

The display apparatus according to the embodiment may include a touch detector that detects contact or proximity of a finger or the like with or to an input surface. FIG. 9 is a sectional view of the display apparatus according to a second modification of the embodiment. As illustrated in FIG. 9, a display apparatus 1B according to the second modification includes a touch detector 5 and a second adhesive layer (e.g., an adhesive layer 170) that is translucent and provided between the substrate 10 and the adhesive layer 80. The adhesive layer 170 is provided between the touch detector 5 and the substrate 10 and is in contact with the touch detector 5. The touch detector 5 is a film with a touch sensor, for example. The touch detector 5 is provided to the first surface 10a of the substrate 10 with the adhesive layer 170 interposed therebetween. The circular polarization plate 150 is provided on the touch detector 5 with the adhesive layer 80 interposed therebetween.

The touch detector 5 performs touch detection by sequentially scanning detection blocks one by one based on drive signals supplied from a drive electrode driver. The touch detector 5 is a capacitive touch panel, for example. The touch detector 5 includes a sensor substrate 53, and drive electrodes Tx, detection electrodes Rx, and wiring L1 provided to the sensor substrate 53.

The drive electrodes Tx and the detection electrodes Rx are disposed in the display region AA, and the wiring L1 is disposed in the peripheral region GA, for example. The drive electrodes Tx are coupled to the terminal of the display apparatus 1B via the wiring L1. The detection electrodes Rx are coupled to the terminal of the display apparatus 1B via another wiring disposed in a layer different from the layer of the wiring L1. The drive electrodes Tx and the detection electrodes Rx are made of translucent conductive material, such as ITO. The drive electrodes Tx and the detection electrodes Rx may be each made of a plurality of metal thin wires.

The touch detector 5 supplies touch detection signals based on change in capacitance between the drive electrodes Tx and the detection electrodes Rx caused by proximity or contact of an external object, such as a finger. The touch detector 5 performs both mutual capacitance touch detection and self-capacitance touch detection. Alternatively, the touch detector 5 may perform one of mutual capacitance touch detection and self-capacitance touch detection.

The sensor substrate 53 is made of translucent film-like resin, for example. The sensor substrate 53 is made of any material that can be deformed by force applied to an input surface IS and may be a glass substrate, for example.

The adhesive layer 170 is a translucent layer and is an optical clear adhesive (OCA), for example. The touch detector 5 is bonded to the first surface 10a of the substrate 10 by the adhesive layer 170. The adhesive layer 170 covers the inorganic light-emitting element 100 and the coupler 75 and flattens the first surface 10a of the substrate 10. The thickness of the adhesive layer 170 is greater than the height of the inorganic light-emitting element 100 with respect to the placement surface 50a (refer to FIG. 7) of the anode electrode 50e serving as a reference plane. A thickness d1 of the adhesive layer 170 is the distance from the placement surface 50a (refer to FIG. 7) of the anode electrode 50e to an upper surface 170a of the adhesive layer 170 in a region (e.g., the peripheral region GA) that is away from the inorganic light-emitting element 100 and where the adhesive layer 170 is flatly formed. In the second modification, the thickness d1 is preferably equal to or greater than 1.5 times the height a (refer to FIG. 7) of the inorganic light-emitting element 100 (d1÷a≥1.5).

Third Modification

In the second modification described above, the first surface 10a of the substrate 10 is flattened by the adhesive layer 170 that bonds the touch detector 5 to the substrate 10.

In the display apparatus including the touch detector, the insulating material for flattening is not limited to the adhesive layer 170. The first surface 10a of the substrate 10 may be flattened by insulating material provided separately from the adhesive layer 170.

Figure 10:
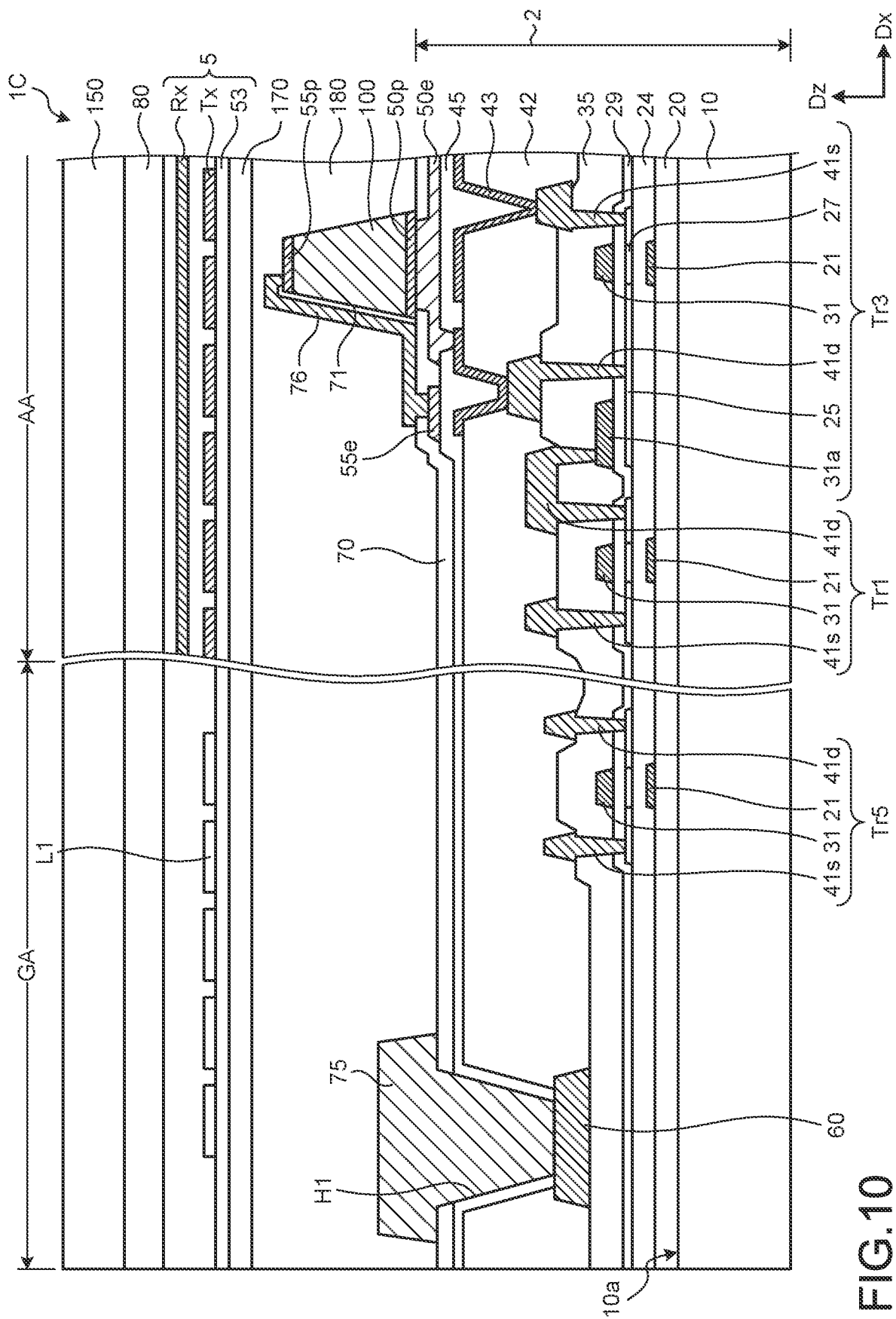
FIG. 10 is a sectional view of the display apparatus according to a third modification of the embodiment.

FIG. 10 is a sectional view of the display apparatus according to a third modification of the embodiment. As illustrated in FIG. 10, a display apparatus 1C according to the third modification includes a translucent flattening layer 180 provided between the substrate 10 and the adhesive layer 170. The thickness of the flattening layer 180 is greater than that of the adhesive layer 170. The flattening layer 180 covers the inorganic light-emitting element 100 and the coupler 75 and flattens the first surface 10a of the substrate 10. The e1 represents the sum of the thickness of the flattening layer 180 and the thickness of the adhesive layer 170. The thickness of the flattening layer 180 is the distance from the placement surface 50a (refer to FIG. 7) of the anode electrode 50e to an upper surface 180a of the flattening layer 180 in a region (e.g., the peripheral region GA) that is away from the inorganic light-emitting element 100 and where the flattening layer 180 is flatly formed. In the third modification, the thickness e1 is preferably equal to or greater than 1.5 times the height a (refer to FIG. 7) of the inorganic light-emitting element 100 (e1÷a≥1.5).

Fourth Modification

Figure 11:
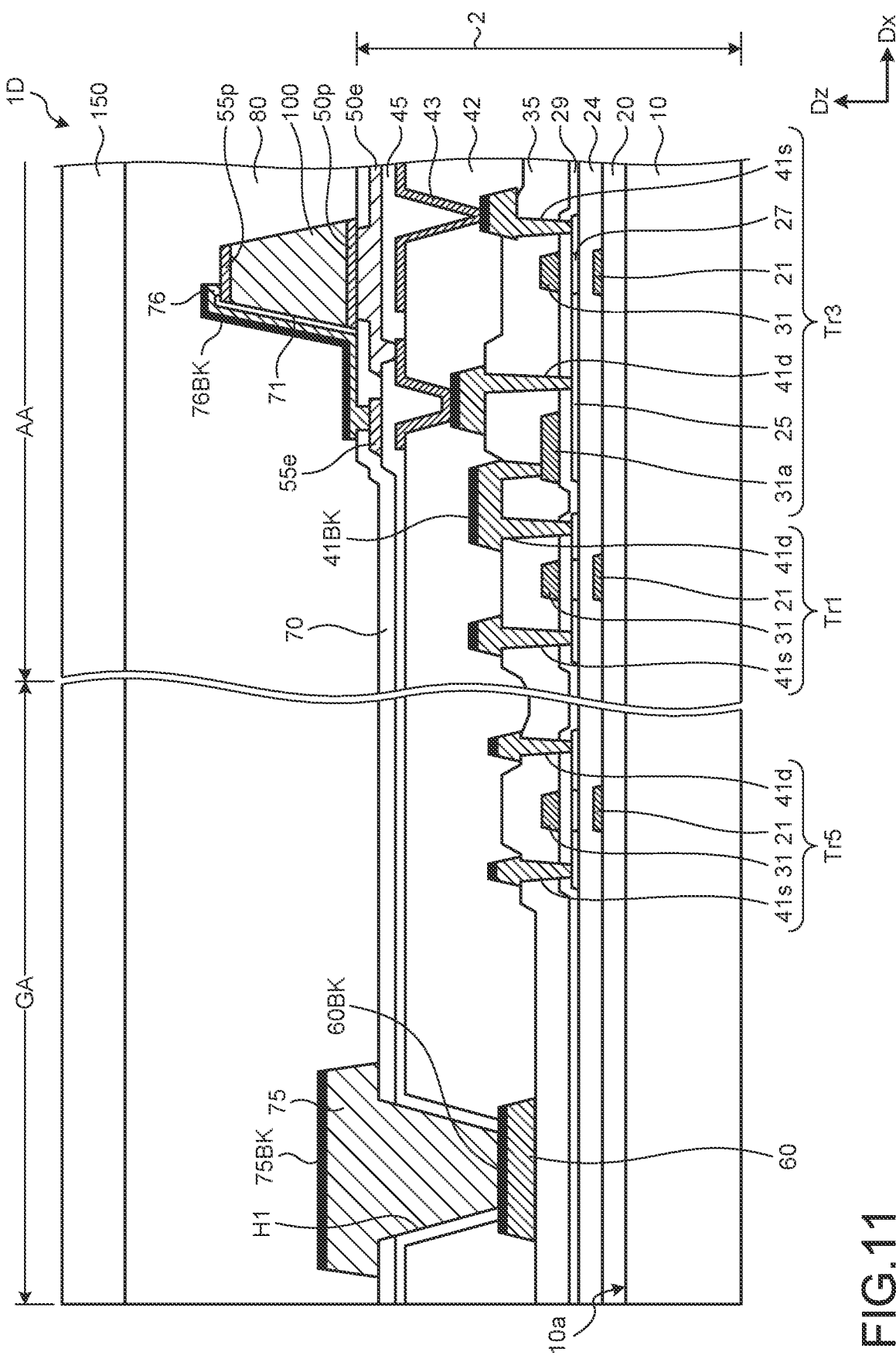
FIG. 11 is a sectional view of the display apparatus according to a fourth modification of the embodiment.

The embodiment may include black members on the wiring coupled to the transistors Tr1 to Tr5. FIG. 11 is a sectional view of the display apparatus according to a fourth modification of the embodiment. As illustrated in FIG. 11, a display apparatus 1D according to the fourth modification includes black conductive members 41BK, 60BK, 75BK, and 76BK as black members. The black conductive members 41BK are provided on the source electrodes 41s and the drain electrodes 41d. The black conductive member 60BK is provided on the cathode wiring 60. The black conductive member 75BK is provided on the coupler 75. The black conductive member 76BK is provided on the conductor 76. The black conductive members 41BK, 60BK, 75BK, and 76BK are made of carbon or metal oxide that assumes a black color by thin-film interference, for example. The black conductive members, such as carbon or metal oxide that assumes a black color by thin-film interference, may also be provided on the first gate line GCL1, the second gate line GCL2, the signal line SGL, the power-supply line LVDD (refer to FIG. 3). This configuration prevents incident light from being reflected by the surface of the wiring because the black conductive members 41BK, 60BK, 75BK, and 76BK, for example, absorb the incident light.

Alternatively, the wiring coupled to the transistors Tr1 to Tr5 may be made of black conductors. In other words, the wiring itself may be black. The first gate line GCL1, the second gate line GCL2, the signal line SGL, the power-supply line LVDD, the source electrode 41s, the drain electrode 41d, the coupler 75, and the conductor 76, for example, may be made of black conductors, such as carbon. This configuration prevents incident light from being reflected by the surface of the wiring because the wiring itself absorbs the incident light.

As described above, the display apparatus 1D and the array substrate 2 according to the fourth modification prevent incident light from being reflected by the surface of the wiring because the wiring is black in planar view viewed in the normal direction (e.g., the third direction Dz) of the first surface 10a of the substrate 10. Consequently, the display apparatus 1D can further prevent reduction in the luminance of an image and deterioration of display quality.

Fifth Modification

In the embodiment above, the cathode electrode 55e is provided on the insulating film 45. The cathode electrode 55e is coupled to the n-type electrode 105 of the inorganic light-emitting element 100 via the conductor 76. The aspect of coupling the cathode electrode 55e to the n-type electrode 105 according to the embodiment is not limited thereto.

Figure 12:
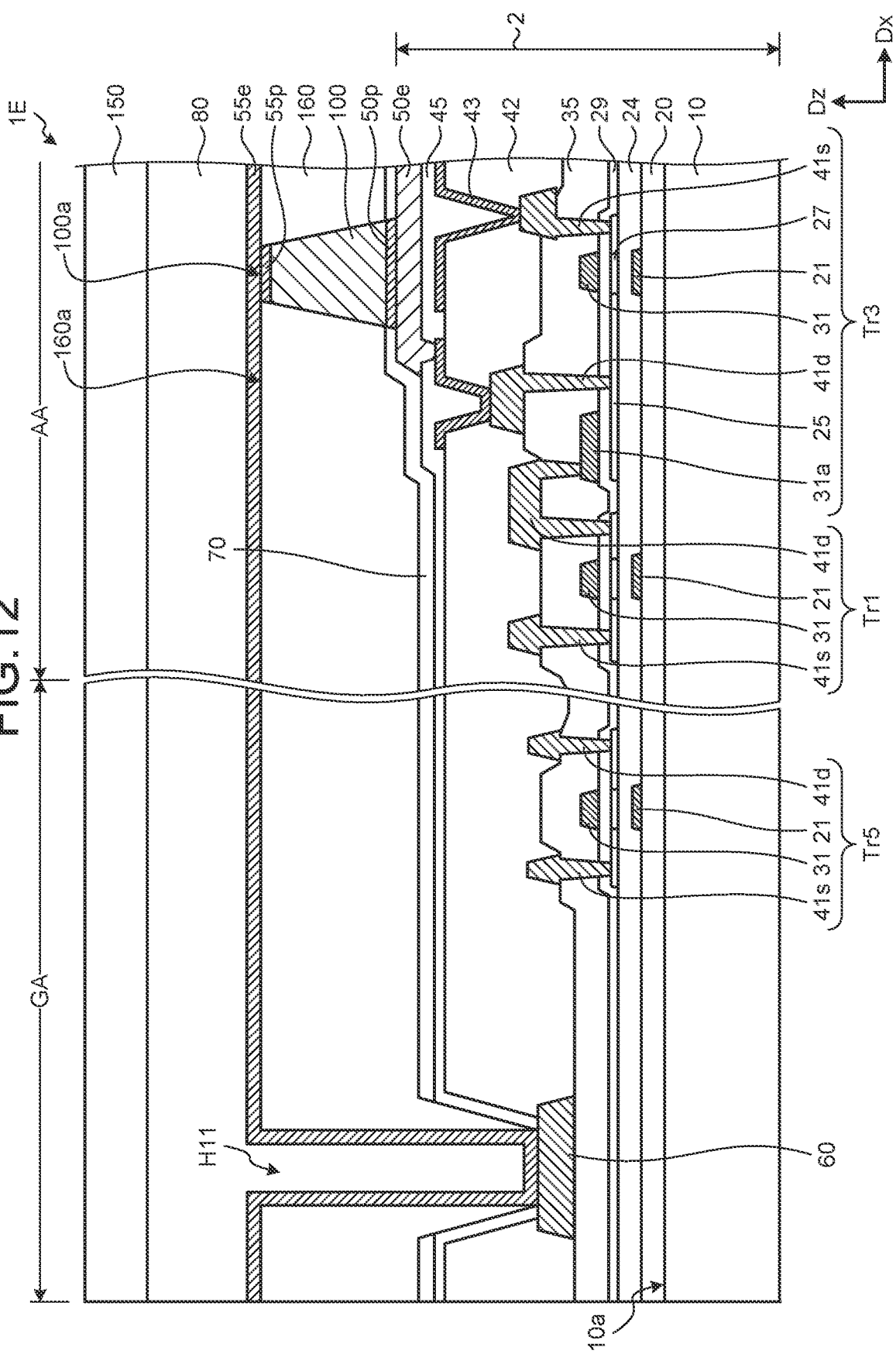
FIG. 12 is a sectional view of the display apparatus according to a fifth modification of the embodiment.

FIG. 12 is a sectional view of the display apparatus according to a fifth modification of the embodiment. As illustrated in FIG. 12, a display apparatus 1E according to the fifth modification includes the cathode electrode 55e not on the insulating film 45 but on the flattening layer 160. In the display apparatus 1E, the upper surface 100a of the inorganic light-emitting element 100 is exposed from the flattening layer 160. The cathode electrode 55e is in contact with the upper surface 100a (cathode terminal 55p) of the inorganic light-emitting element 100 exposed from the flattening layer 160.

In peripheral region GA, the flattening layer 160 and the insulating films 70, 45, and 42 have a contact hole H11 the bottom surface of which corresponds to the cathode wiring 60. The cathode electrode 55e extends from the upper surface 160a of the flattening layer 160 and then along the inner surface of the contact hole H11, and is coupled to the cathode wiring 60. The adhesive layer 80 and the circular polarization plate 150 are provided on the cathode electrode 55e in the order as listed. The adhesive layer 80 is disposed in the contact hole H11 and flattens the first surface 10a of the substrate 10.

Figure 13:
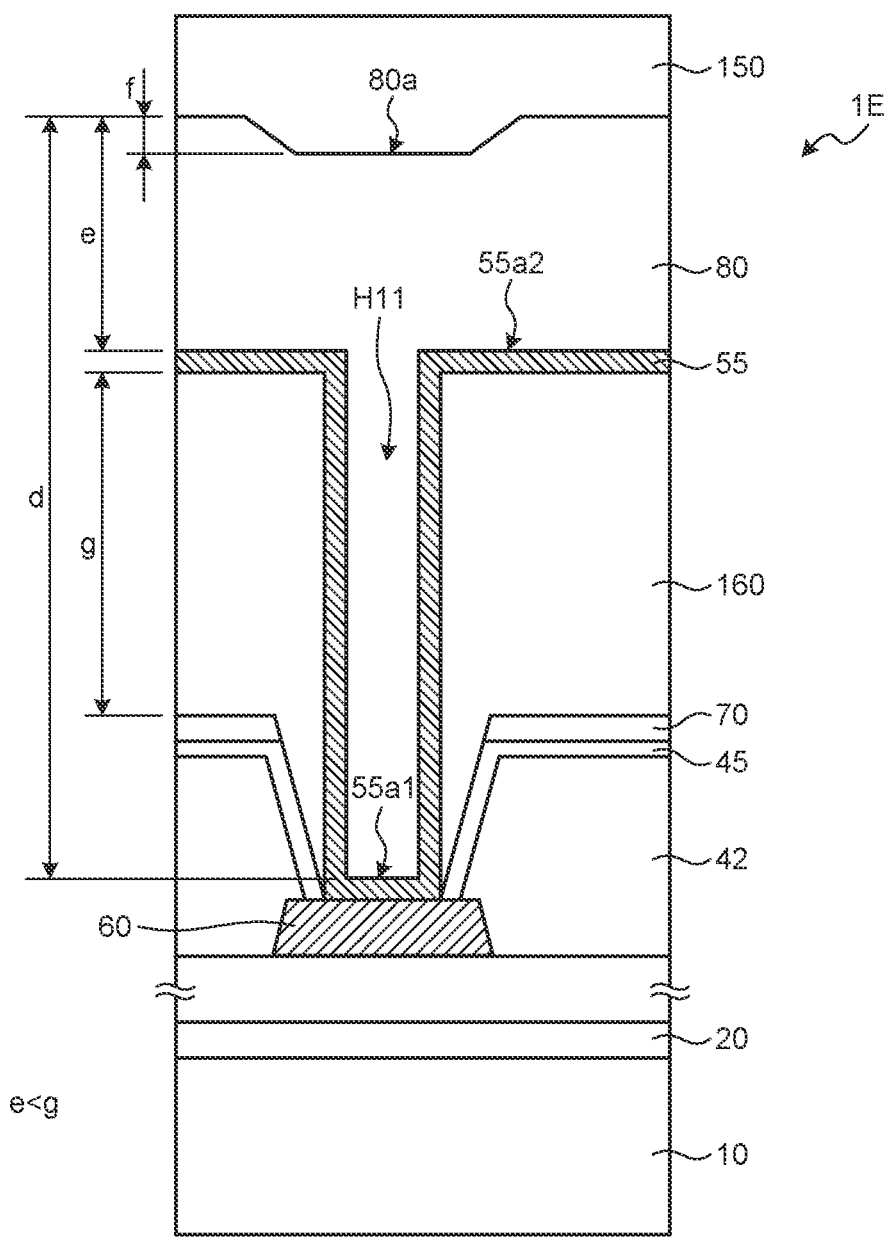
FIG. 13 is a sectional view illustrating a relation between a level difference in a peripheral region and the thickness of the adhesive layer.

FIG. 13 is a sectional view illustrating a relation between a level difference in the peripheral region and the thickness of the adhesive layer. As illustrated in FIG. 13, the display apparatus 1E has the largest level difference of the flattening layer 160 near the contact hole H11 in the peripheral region GA. The d represents the distance from an upper surface 55a1 of the cathode electrode 55e at the bottom of the contact hole H11 to the circular polarization plate 150. The e represents the distance from an upper surface 55a2 of the cathode electrode 55e to the circular polarization plate 150 outside the contact hole H11. The distance e corresponds to the thickness of the adhesive layer 80. The thickness (distance) e of the adhesive layer 80 is greater than the thickness of the inorganic light-emitting element 100 (refer to FIG. 6). The thickness of the inorganic light-emitting element 100 is the distance from the placement surface 50a (refer to FIG. 6) of the anode electrode 50e to the upper surface 100a (refer to FIG. 6) of the inorganic light-emitting element 100.

In FIG. 13, the g represents the distance from the upper surface of the insulating film 70 to the cathode electrode 55e. The distance g corresponds to the thickness of the flattening layer 160. The thickness (distance) g of the flattening layer 160 is greater than the thickness of the inorganic light-emitting element 100 (refer to FIG. 6). As illustrated in FIG. 13, the thickness g of the flattening layer 160 is greater than the thickness e of the adhesive layer 80 (e<g). With this structure, the level difference of the inorganic light-emitting element 100 is reduced mainly by the flattening layer 160.

In the fifth modification, the distance d is preferably equal to or less than 1.5 times the distance e (d÷e≤1.5). This structure can decrease a level difference on the upper surface 80a of the adhesive layer 80, thereby increasing the flatness of the adhesive layer 80. For example, the f represents the maximum level difference of the upper surface 80a of the adhesive layer 80 in the peripheral region GA. When d÷e≤1.5 is satisfied, the flatness of the adhesive layer 80 can be 30 or greater. The flatness is expressed by 100×(e−f)÷e. If the flatness of the adhesive layer 80 is 30 or greater, the circular polarization plate 150 can be easily bonded in parallel to the first surface 10a of the substrate 10.

Sixth Modification

Figure 14:
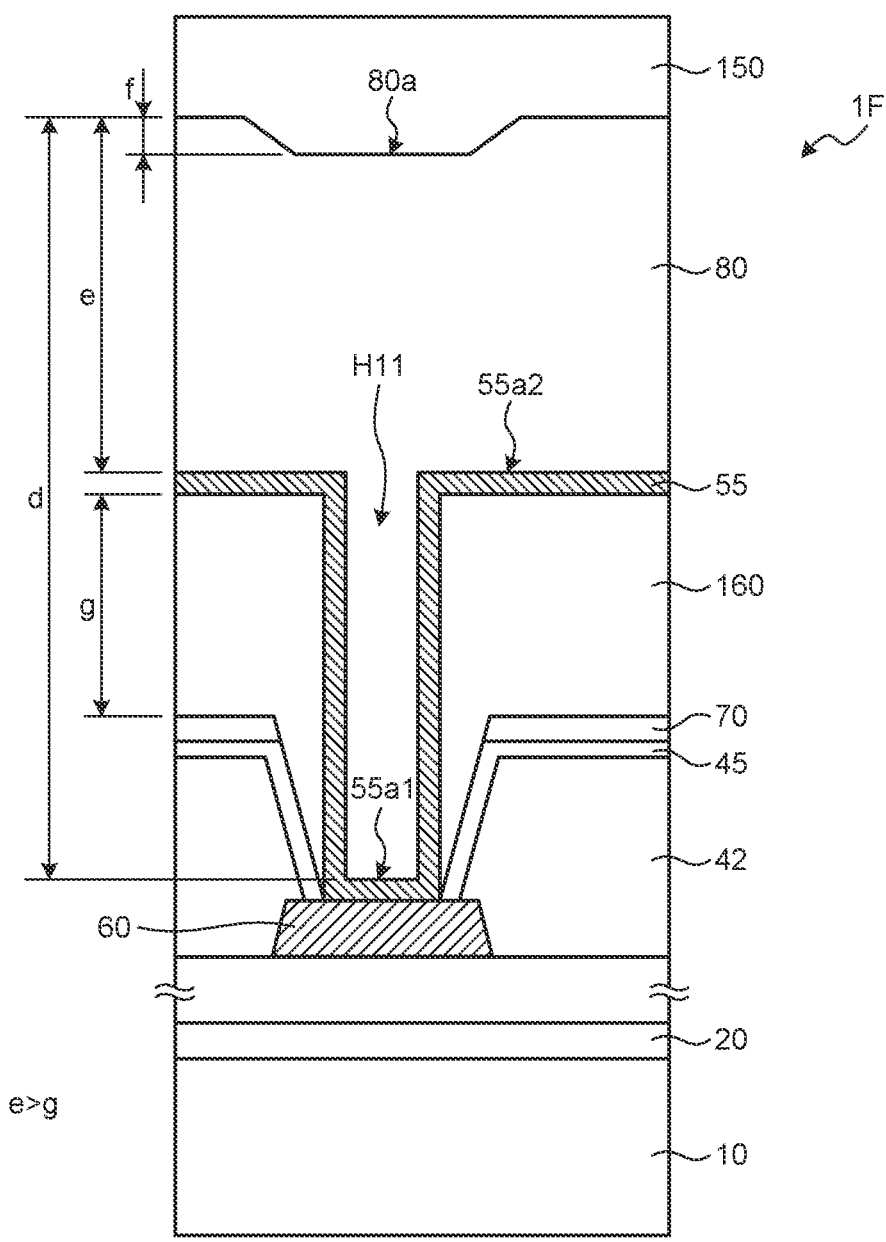
FIG. 14 is a sectional view of the display apparatus according to a sixth modification of the embodiment.

While the thickness of the flattening layer 160 according to the fifth modification is greater than that of the adhesive layer 80, the embodiment is not limited thereto. FIG. 14 is a sectional view of the display apparatus according to a sixth modification of the embodiment. As illustrated in FIG. 14, the thickness g of the flattening layer 160 is greater than that of the inorganic light-emitting element 100 also in a display apparatus 1F according to the sixth modification. The thickness e of the adhesive layer 80 is also greater than that of the inorganic light-emitting element 100. The thickness e of the adhesive layer 80 is greater than the thickness g of the flattening layer 160 (e<g). With this structure, the level difference of the inorganic light-emitting element 100 is reduced by the flattening layer 160. If a level difference remains after the flattening layer 160 is formed, the level difference is reduced by the adhesive layer 80.

Also in the sixth modification, the distance d is preferably equal to or less than 1.5 times the distance e (d÷e≤1.5). This structure can decrease a level difference on the upper surface 80a of the adhesive layer 80, thereby increasing the flatness of the adhesive layer 80.

Seventh Modification

Figure 15:
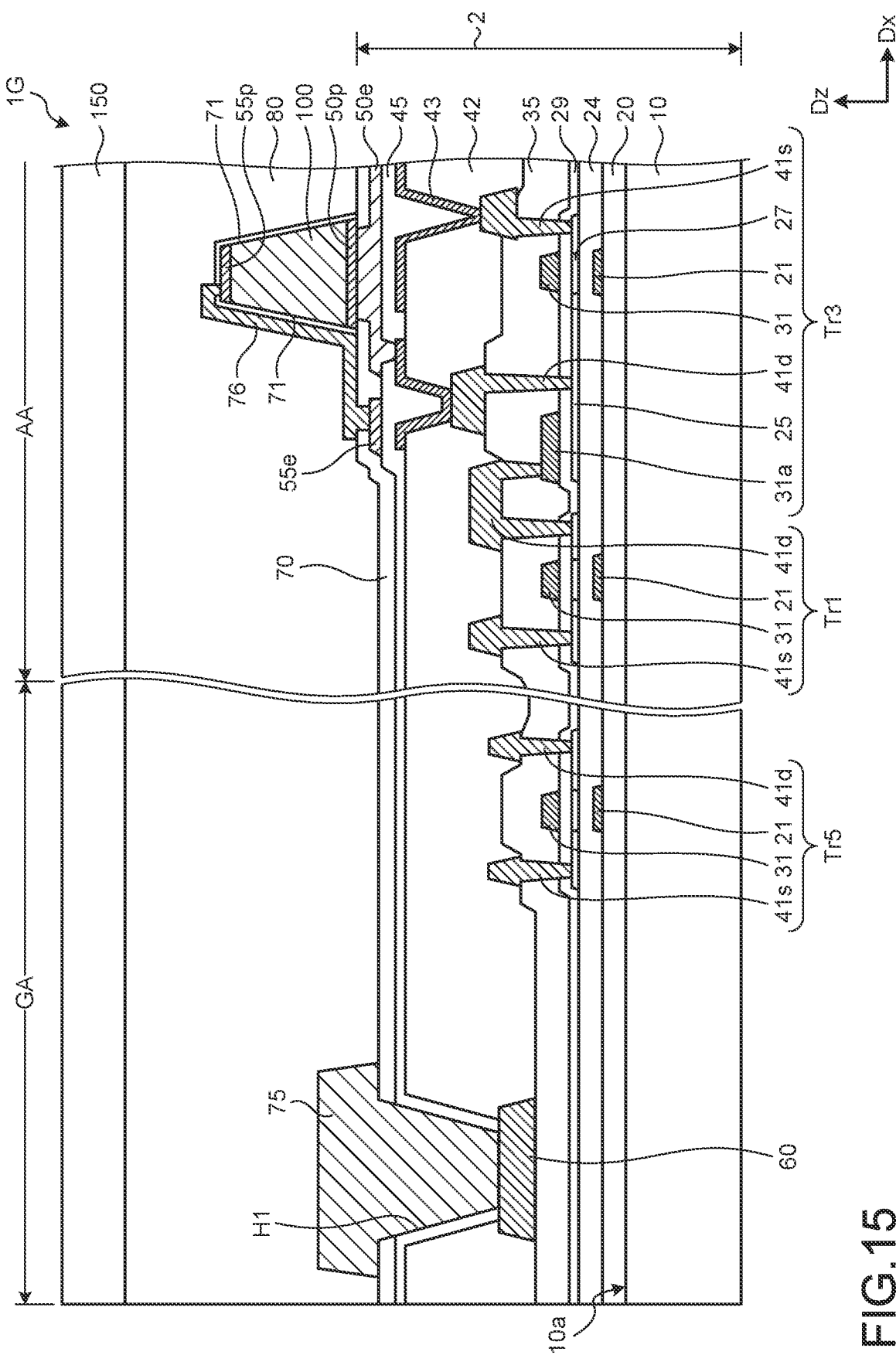
FIG. 15 is a sectional view of the display apparatus according to a seventh modification of the embodiment.

FIG. 15 is a sectional view of the display apparatus according to a seventh modification of the embodiment. As illustrated in FIG. 15, the inorganic light-emitting element 100 in a display apparatus 1G according to the seventh modification is covered with the insulating film 71 except for the part (cathode terminal 55p) coupled to the conductor 76. With this configuration, the insulating film 71 can prevent moisture from entering into the inorganic light-emitting element 100 from the adhesive layer 80. As a result, the inorganic light-emitting element 100 is less likely to be in contact with moisture. Consequently, the display apparatus 1G can prevent deterioration of properties and reliability of the inorganic light-emitting element 100 due to contact with moisture.

The aspect like the display apparatus 1G in which the inorganic light-emitting element 100 is covered with the insulating film 71 except for the part coupled to the conductor 76 can be applied to the display apparatus 1 (refer to FIGS. 4 and 5), the display apparatus 1A (FIG. 8), the display apparatus 1B (refer to FIG. 9), the display apparatus 1C (FIG. 10), and the display apparatus 1D (FIG. 11). With this configuration, the insulating film 71 can prevent moisture from entering into the inorganic light-emitting element 100 from the adhesive layer 80 also in the display apparatuses 1, 1A, 1B, 1C, and 1D.

Eighth Modification

Figure 16:
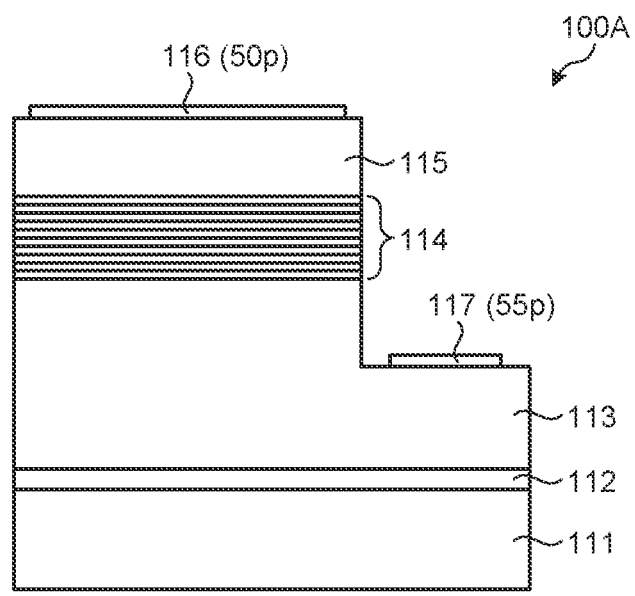
FIG. 16 is a sectional view of the inorganic light-emitting element according to an eighth modification of the embodiment.

The inorganic light-emitting element according to the embodiment is not limited to the aspect illustrated in FIG. 6. FIG. 16 is a sectional view of the inorganic light-emitting element according to an eighth modification of the embodiment. As illustrated in FIG. 16, an inorganic light-emitting element 100A according to the eighth modification includes a substrate 111, a buffer layer 112, an n-type cladding layer 113, an active layer 114, a p-type cladding layer 115, a p-type electrode layer 116 (anode terminal 50p), and an n-type electrode layer 117 (cathode terminal 55p). The buffer layer 112, the n-type cladding layer 113, the active layer 114, the p-type cladding layer 115, and the p-type electrode layer 116 are layered in the order as listed from a first surface of the substrate 111. The n-type cladding layer 113 has a region exposed from the active layer 114. This region is provided with the n-type electrode layer 117.

The substrate 111 is made of sapphire, for example. The n-type cladding layer 113 is made of n-type GaN. The active layer 114 is made of InGaN. The p-type cladding layer 115 is made of p-type GaN. The p-type electrode layer 116 is made of palladium (Pd) and gold (Au) and has a multilayered structure in which Au is layered on Pd. The n-type electrode layer 117 is made of indium (In).

In the inorganic light-emitting element 100A, the p-type cladding layer 115 and the n-type cladding layer 113 are not directly bonded, and another layer (active layer 114) is provided therebetween. With this configuration, carriers, such as electrons and holes, can be concentrated in the active layer 114, thereby efficiently recombining the carriers (emitting light). The active layer 114 may have a multi-quantum well structure (MQW structure) in which well layers and barrier layers composed of several atomic layers are cyclically layered for higher efficiency.

Ninth Modification

Figure 17:
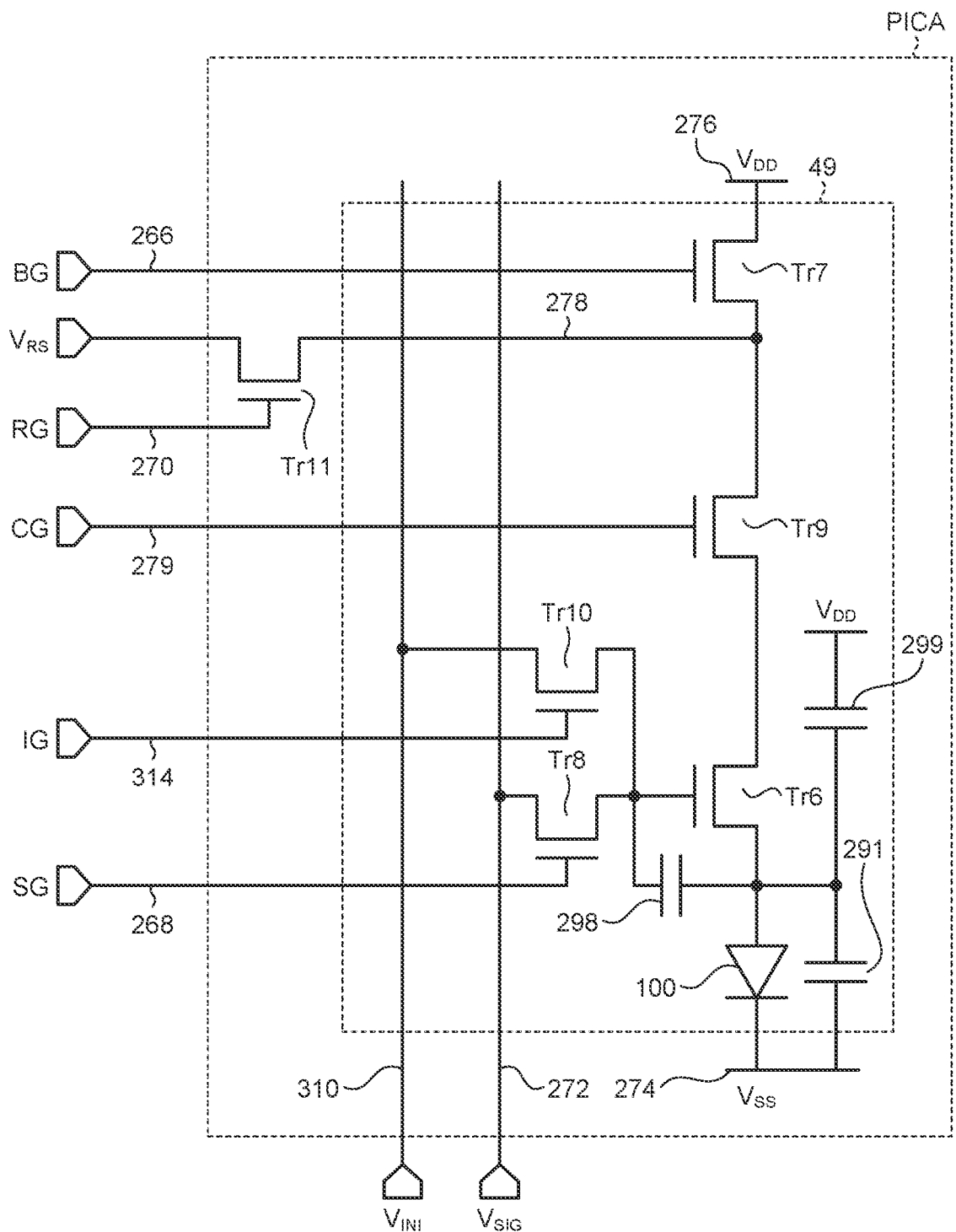
FIG. 17 is a circuit diagram of a pixel circuit according to a ninth modification of the embodiment.

The configuration of the pixel circuit according to the present embodiment is not limited to that illustrated in FIG. 3. FIG. 17 is a circuit diagram of the pixel circuit according to a ninth modification of the embodiment. As illustrated in FIG. 17, a pixel circuit PICA according to the ninth modification of the embodiment includes a drive transistor Tr6, a lighting switch Tr7, a writing switch Tr8, a light-emission control switch Tr9, an initialization switch Tr10, and a reset switch Tr11.

The cathode (cathode terminal 55p) of the inorganic light-emitting element 100 is coupled to a power-supply line 274. The anode (anode terminal 50p) of the inorganic light-emitting element 100 is coupled to a power-supply line 276 via the drive transistor Tr6 and the lighting switch Tr7.

The power-supply line 276 is supplied with a predetermined high voltage as drive potential $V_{DD}$ from a drive power source. The power-supply line 274 is supplied with a predetermined low voltage as reference potential $V_{SS}$ from a power-supply circuit.

The inorganic light-emitting element 100 is supplied with a forward current (drive current) and emits light by the potential difference ($V_{DD}$–$V_{SS}$) between the drive potential $V_{DD}$ and the reference potential $V_{SS}$. In other words, the drive potential $V_{DD}$ has a potential difference for causing the inorganic light-emitting element 100 to emit light with respect to the reference potential $V_{SS}$. Capacitance 291 serving as an equivalent circuit is provided between the anode terminal 50p and the cathode terminal 55p and coupled in parallel with the inorganic light-emitting element 100. Additional capacitance 299 is provided between the anode terminal 50p of the inorganic light-emitting element 100 and the power-supply line 276 that supplies the drive potential $V_{DD}$. The capacitance 291 may be coupled to a reference potential other than the anode terminal 50p and the cathode terminal 55p.

The drive transistor Tr6, the lighting switch Tr7, and the light-emission control switch Tr9 according to the present embodiment are n-type TFTs. The source electrode of the drive transistor Tr6 is coupled to the anode terminal 50p of the inorganic light-emitting element 100, and the drain electrode thereof is coupled to the source electrode of the light-emission control switch Tr9. The gate electrode of the light-emission control switch Tr9 is coupled to a light-emission control line 279. The drain electrode of the light-emission control switch Tr9 is coupled to the source electrode of the lighting switch Tr7. The gate electrode of the lighting switch Tr7 is coupled to a lighting control line 266. The drain electrode of the lighting switch Tr7 is coupled to the power-supply line 276. The gate electrode of the reset switch Tr11 is coupled to a reset control line 270. The gate electrode of the writing switch Tr8 is coupled to a writing control line 268. The gate electrode of the initialization switch Tr10 is coupled to an initialization control line 314.

The drain electrode of the drive transistor Tr6 is also coupled to a reset power source via the reset switch Tr11. In the present modification, reset lines 278 and the reset switches Tr11 are provided for respective pixel rows. The reset lines 278 each extend along the corresponding pixel row. The reset line 278 is coupled in common to the drain electrodes of the drive transistors Tr6 of the corresponding pixel row via the light-emission control switches Tr9 of the corresponding pixel row. In other words, the pixels 49 constituting the pixel row share the reset line 278 and the reset switch Tr11. The reset switch Tr11 is disposed at an end of the pixel row, for example, and switches between coupling and decoupling the reset line 278 and the reset power source, that is, determines whether to couple or decouple between them. The reset switch Tr11 according to the present modification is an n-type TFT like the drive transistor Tr6, the lighting switch Tr7, and the light-emission control switch Tr9.

The gate electrode serving as a control terminal of the drive transistor Tr6 is coupled to a video signal line 272 via the writing switch Tr8 and coupled to an initialization signal line 310 via the initialization switch Tr10. Holding capacitance 298 is coupled between the gate electrode and the source electrode of the drive transistor Tr6. The writing switch Tr8 and the initialization switch Tr10 according to the present embodiment are n-type TFTs like the drive transistor Tr6, the lighting switch Tr7, and the reset switch Tr11.

While the present embodiment describes a circuit example in which the drive transistor Tr6, the lighting switch Tr7, the reset switch Tr11, the writing switch Tr8, the light-emission control switch Tr9, and the initialization switch Tr10 are n-type TFTs, the present embodiment is not limited thereto. The drive transistor Tr6, the lighting switch Tr7, the reset switch Tr11, the writing switch Tr8, the light-emission control switch Tr9, and the initialization switch Tr10 may be p-type TFTs. Alternatively, the present embodiment has a circuit configuration combining p-type TFTS and n-type TFTs.

FIG. 17 illustrates various signals, including a writing control signal SG supplied to the writing switch Tr8, a lighting control signal BG supplied to the lighting switch Tr7, a reset control signal RG supplied to the reset switch Tr11, a light-emission control signal CG supplied to the light-emission control switch Tr9, and an initialization control signal IG supplied to the initialization switch Tr10.

In the present modification, an operation of selecting a plurality of pixel rows in order from the first row (e.g., the pixel row positioned at the uppermost part of the display region AA in FIG. 1), writing an electric potential Vsig (video writing potential) of video voltage signal VSIG to the pixels 49 of the selected pixel rows, and causing the inorganic light-emitting elements 100 to emit light is repeated in units of an image of one frame. The drive circuit applies the electric potential Vsig (video writing potential) of the video voltage signal VSIG to the video signal line 272 and applies an electric potential Vini (initialization potential) of an initialization voltage signal VINI to the initialization signal line 310 in each horizontal scanning period.

The writing operation according to the present modification can be specifically divided into a reset operation, an offset canceling operation, and a video signal setting operation. The reset operation is an operation for resetting the voltage held in the capacitance 291, the holding capacitance 298, and the additional capacitance 299. The offset canceling operation is an operation for compensating fluctuations in a threshold voltage Vth of the drive transistor Tr6. The video signal setting operation is an operation for writing the electric potential Vsig (video writing potential) of the video voltage signal VSIG to the pixels 49.

The writing operation (the reset operation, the offset canceling operation, and the video signal setting operation) and the light-emitting operation are sequentially performed pixel row by pixel row. The pixel row is sequentially selected in a cycle of one horizontal scanning period for the video signal, for example. The writing operation and the light-emitting operation performed pixel row by pixel row are repeated in a cycle of one frame.

The light-emission enable period of each pixel row is set to a period within a period from the end of the video signal setting operation to the start of the writing operation for the pixel row of the image of the next frame. In the light-emission enable period, the display apparatus 1 has a light-emission period and a non-light-emission period. The light-emission period is a period for causing the inorganic light-emitting elements 100 to emit light with the intensity corresponding to the electric potential Vsig (video writing potential) of the video voltage signal VSIG written to each pixel 49. The non-light-emission period is a period for forcibly stopping the supply of the drive current to the inorganic light-emitting elements 100. Specifically, in the light-emission period, the display apparatus 1 switches the light-emission control signal CG to the H level to turn on the light-emission control switch Tr9, thereby supplying the forward current (drive current) to the inorganic light-emitting element 100 from the drive power source. In the non-light-emission period, the display apparatus 1 switches the light-emission control signal CG to the L level to turn off the light-emission control switch Tr9, thereby decoupling the drive power source and the drive transistor Tr6 held in the coupled state. As a result, the display apparatus 1 forcibly stops the forward current (drive current) to be supplied to the inorganic light-emitting element 100.

While an exemplary embodiment according to the present disclosure has been described, the embodiment is not intended to limit the disclosure. The contents disclosed in the embodiment are given by way of example only, and various changes may be made without departing from the spirit of the present disclosure. The embodiment may be combined with the modifications, or the modifications may be combined. Appropriate changes made without departing from the spirit of the present disclosure naturally fall within the technical scope of the disclosure. At least one of various omissions, substitutions, and changes of the components may be made without departing from the gist of the embodiment and the modifications described above.

What is claimed is:
1. A display apparatus comprising:
a substrate;
a plurality of pixels arrayed on the substrate;
a plurality of inorganic light-emitting elements that are provided in the pixels, respectively;
a transistor provided to a first surface of the substrate and coupled to one of the inorganic light-emitting elements; and
wiring provided to the first surface of the substrate and coupled to the transistor, wherein
the one of the inorganic light-emitting elements includes a first terminal, a second terminal positioned above the first terminal, and a side surface positioned between the first terminal and the second terminal,
an insulating film is positioned at part of the side surface,
a conductive film is positioned on the insulating film, and the insulating film is positioned between the side surface and the conductive film, and
the conductive film is in contact with the second terminal.

2. The display apparatus according to claim 1, further comprising:
an electrode provided at a position not overlapping the inorganic light-emitting elements in planar view, wherein
the conductive film couples the second terminal and the electrode.

3. The display apparatus according to claim 1, wherein the insulating film has a part in contact with an upper surface of the second terminal, and
the conductive film covers the part and is in contact with the upper surface of the second terminal.

4. The display apparatus according to claim 1, wherein the conductive film overlaps an entire area of the insulating film.

5. The display apparatus according to claim 1, wherein a part of an upper surface of the second terminal is exposed from the conductive film.

6. The display apparatus according to claim 1, wherein a part of an upper surface of the second terminal is exposed from the insulating film.

7. A display apparatus comprising:
a substrate;
a plurality of pixels arrayed on the substrate;
a plurality of inorganic light-emitting elements that are provided in the pixels, respectively;
a transistor provided to a first surface of the substrate and coupled to one of the inorganic light-emitting elements; and
wiring provided to the first surface of the substrate and coupled to the transistor,
wherein
the one of the inorganic light-emitting elements includes a first terminal, a second terminal positioned above the first terminal, and a side surface positioned between the first terminal and the second terminal,
an insulating film is positioned over an entire area of the side surface,
a conductive film is positioned on part of the insulating film, and the insulating film is positioned between the side surface and the conductive film, and
the conductive film is in contact with the second terminal.

8. The display apparatus according to claim 7, further comprising:
an electrode provided at a position not overlapping the inorganic light-emitting elements in planar view, wherein
the conductive film couples the second terminal and the electrode.

9. The display apparatus according to claim 7, wherein the insulating film includes a first part in contact with an upper surface of the second terminal and covered with the conductive film and a second part in contact with the upper surface of the second terminal and not in contact with the conductive film, and
the conductive film is in contact with the upper surface of the second terminal.

10. The display apparatus according to claim 7, wherein a contact hole is disposed in the insulating film,
the conductive film is in direct contact with an upper surface of the second terminal via the contact hole.

11. The display apparatus according to claim 7, wherein a part of an upper surface of the second terminal is exposed from the conductive film.

12. A display apparatus comprising:
a substrate;
a plurality of pixels arrayed on the substrate;
a plurality of inorganic light-emitting elements that are provided in the pixels, respectively;
a transistor provided to a first surface of the substrate and coupled to one of the inorganic light-emitting elements; and
wiring provided to the first surface of the substrate and coupled to the transistor,
wherein
the one of the inorganic light-emitting elements includes a first terminal, a second terminal positioned above the first terminal, and a side surface positioned between the first terminal and the second terminal,
an insulating film covers part of the side surface,
a conductive film covers the insulating film, and
the conductive film is in contact with the second terminal.

13. The display apparatus according to claim 12, further comprising:
an electrode provided at a position not overlapping the inorganic light-emitting elements in planar view, wherein
the conductive film couples the second terminal and the electrode.

14. The display apparatus according to claim 12, wherein the insulating film has a part in contact with an upper surface of the second terminal, and
the conductive film covers the part and is in contact with the upper surface of the second terminal.

15. The display apparatus according to claim 12, wherein the conductive film overlaps an entire area of the insulating film.

16. The display apparatus according to claim 12, wherein a part of an upper surface of the second terminal is exposed from the conductive film.

17. The display apparatus according to claim 12, wherein a part of an upper surface of the second terminal is exposed from the insulating film.

\* \* \* \* \*